(12) United States Patent
Seki et al.

(10) Patent No.: US 7,190,057 B2
(45) Date of Patent: Mar. 13, 2007

(54) PACKAGING COMPONENT AND SEMICONDUCTOR PACKAGE

(75) Inventors: Kazumitsu Seki, Nagano (JP); Takashi Yoshie, Nagano (JP); Harunobu Sato, Nagano (JP); Yoshihito Miyahara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 10/835,007

(22) Filed: Apr. 30, 2004

(65) Prior Publication Data

US 2004/0232534 A1 Nov. 25, 2004

(30) Foreign Application Priority Data

May 22, 2003 (JP) .............................. 2003-145216

(51) Int. Cl.
*H01L 23/02* (2006.01)
(52) U.S. Cl. ..................................... 257/678
(58) Field of Classification Search ................ 257/678, 257/666, 676
See application file for complete search history.

(56) References Cited

U.S. PATENT DOCUMENTS

| 4,888,449 | A |   | 12/1989 | Crane et al. | |
| 5,367,196 | A |   | 11/1994 | Mahulikar et al. | |
| 5,585,195 | A | * | 12/1996 | Shimada | 428/548 |
| 5,722,161 | A |   | 3/1998 | Marrs | |
| 6,150,713 | A |   | 11/2000 | Park et al. | |
| 7,049,683 | B1 | * | 5/2006 | Sirinorakul et al. | 257/666 |
| 2002/0153596 | A1 |   | 10/2002 | Tsubosaki et al. | |

FOREIGN PATENT DOCUMENTS

| JP | 63-160367 | 7/1988 |
| JP | 2-209759 | 8/1990 |
| JP | 6-29439 | 2/1994 |
| JP | 9-148509 | 6/1997 |
| JP | 9-331009 | 12/1997 |
| JP | 10-173117 | 6/1998 |
| JP | 10-313081 | 11/1998 |
| JP | 2002-299538 | 10/2002 |

\* cited by examiner

*Primary Examiner*—Roy Karl Potter
(74) *Attorney, Agent, or Firm*—Staas & Halsey LLP

(57) ABSTRACT

A packaging component used for constituting a package mounting a semiconductor element, and a semiconductor package using the packaging component. The packaging component has on at least a portion of the surface thereof a covered surface which is sealed with an insulating resin or on which an adhesive layer is applied, and the packaging component comprises a conductor substrate and an electrically conducting layer partly or entirely covering the surface thereof, and the electrically conducting layer comprises a rough-surface plated layer having a roughened surface profile on the covered surface. The packaging component includes, for example, a lead frame and a heat-radiating or heat-dissipating plate.

45 Claims, 25 Drawing Sheets

Fig. 3
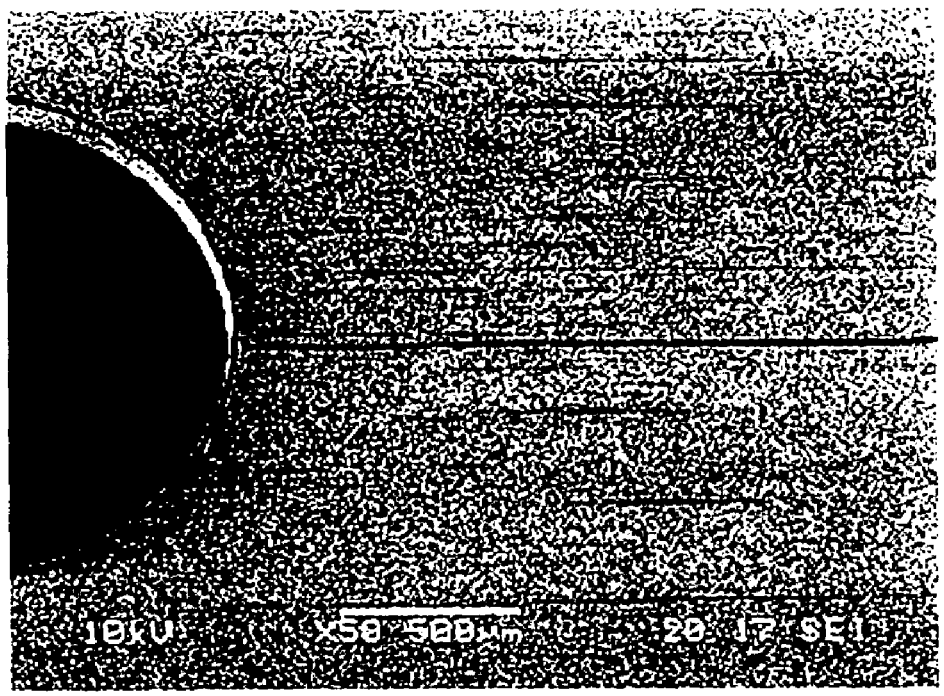
(A)
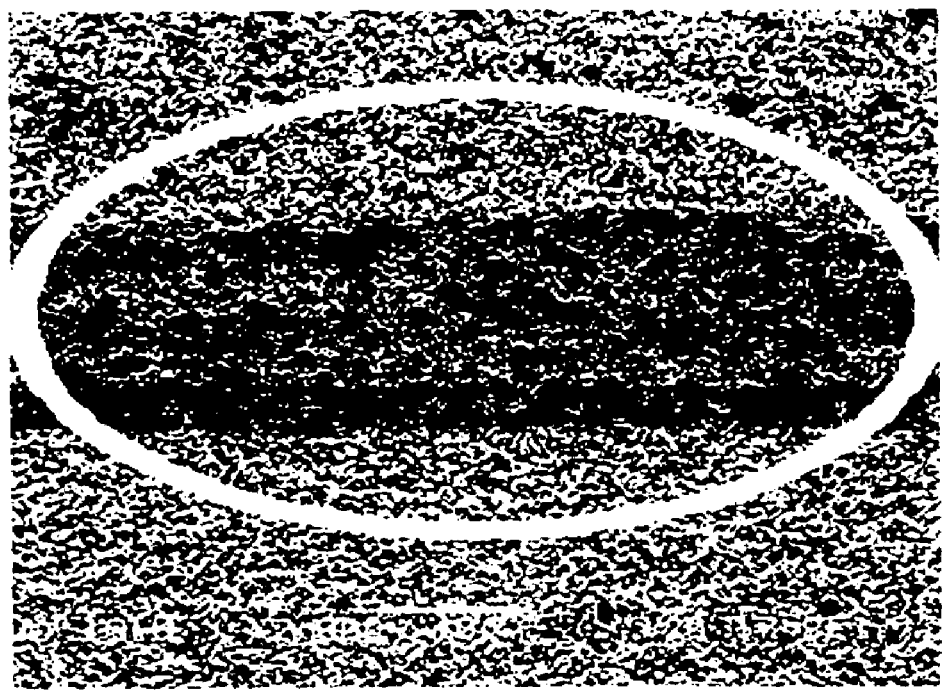
(B)

Fig.4
(A)
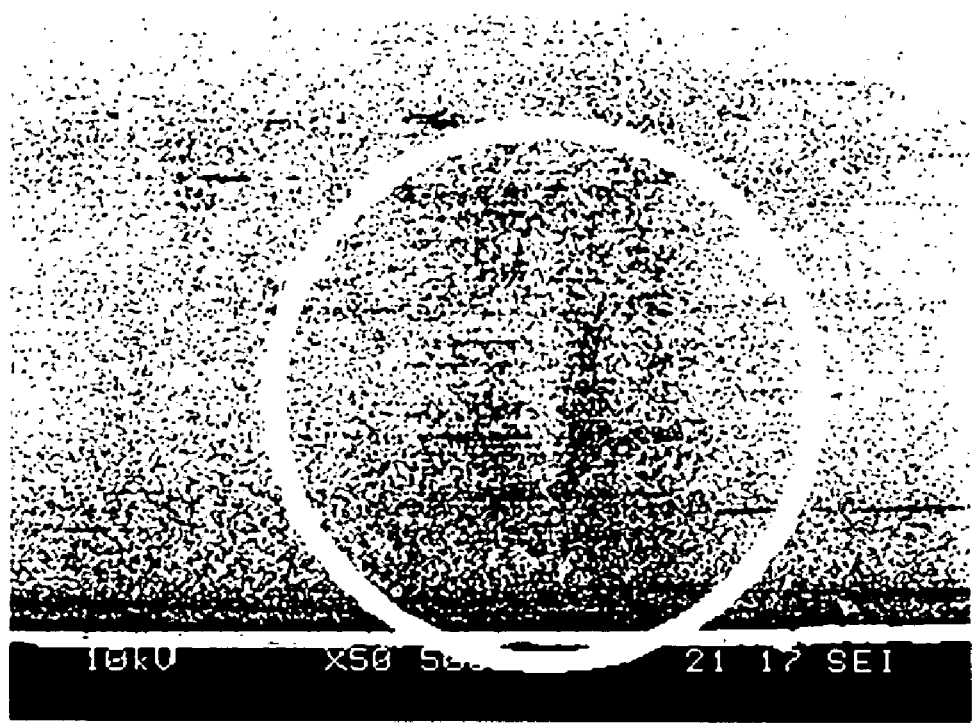
(B)
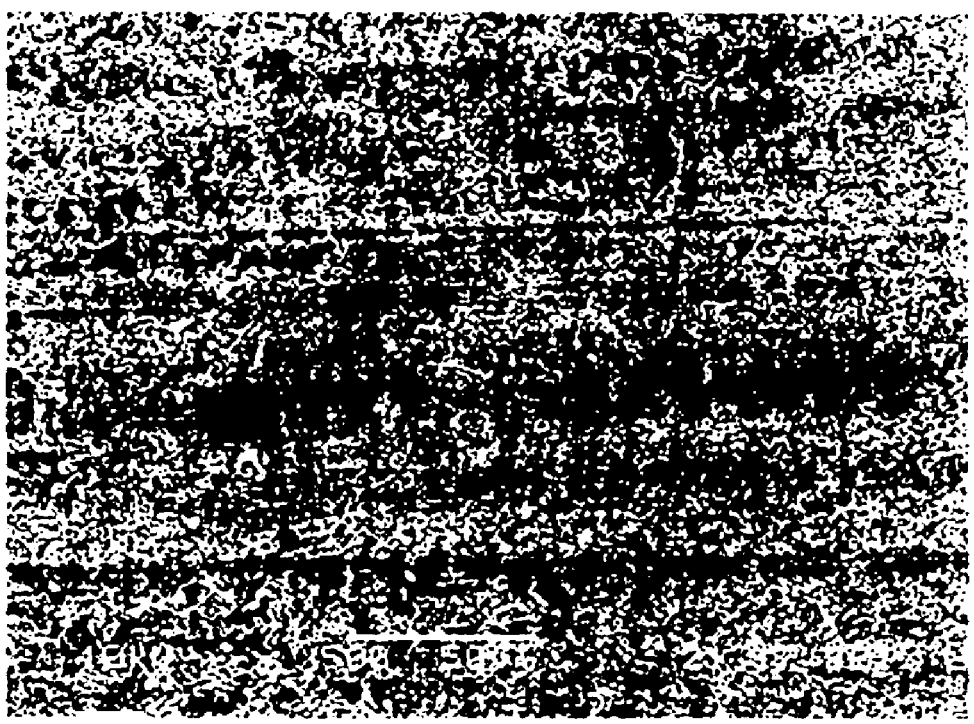

Fig.20
Ni : 0.5 μm
(A)
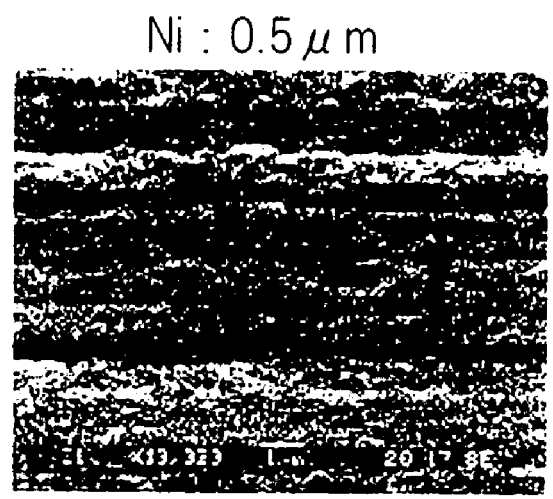
Ni : 0.5 μm
(B)
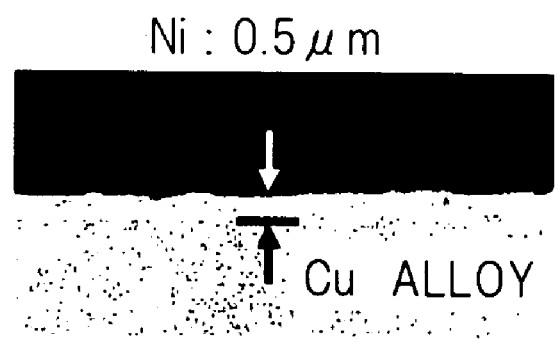
Cu ALLOY
Ni : 0.5 μm    【Ra : 17.6nm】
(C)
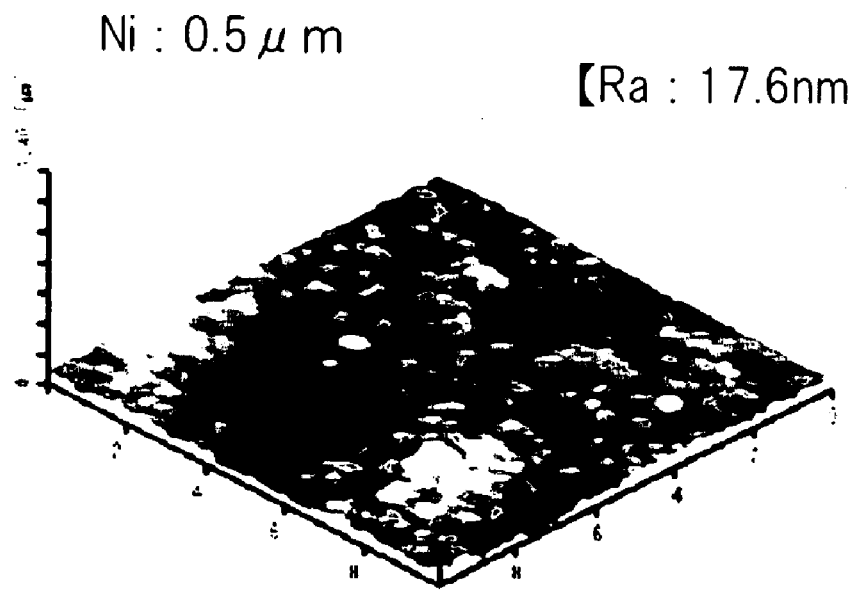

Fig. 24
(A)
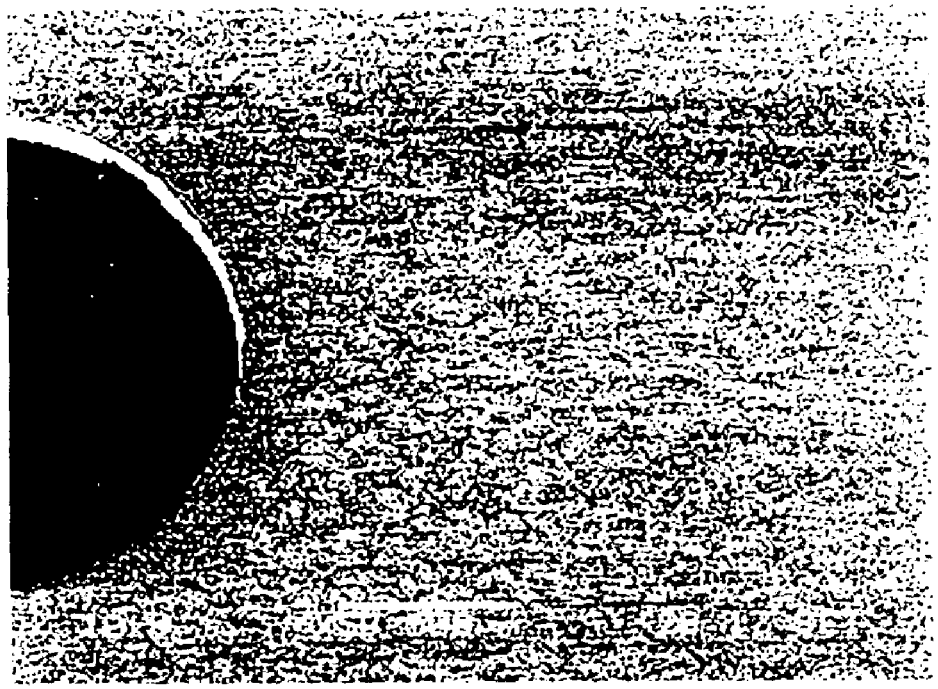
(B)
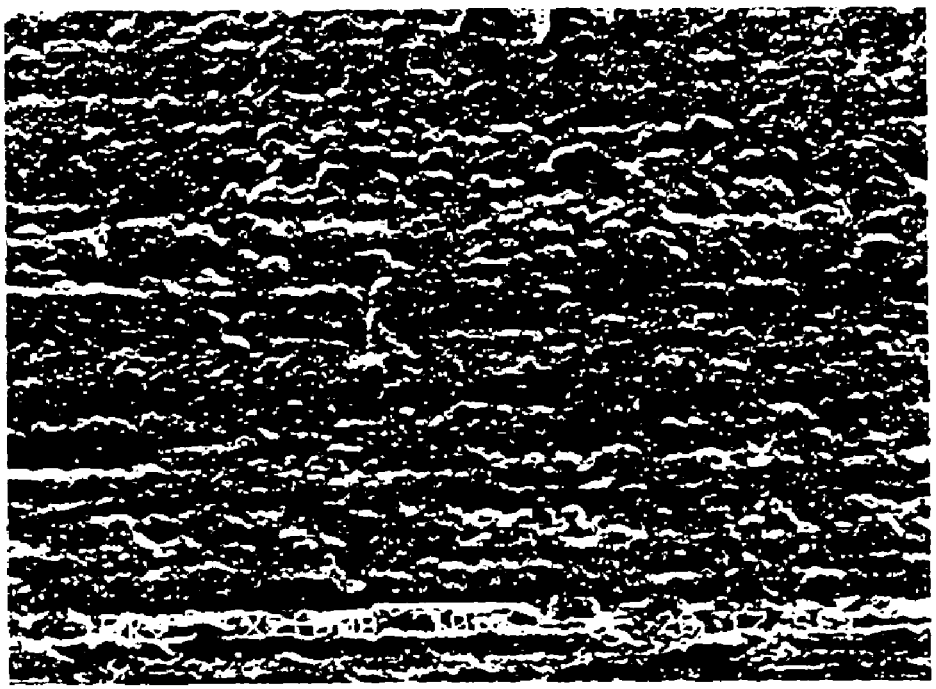

Fig.25
(A)
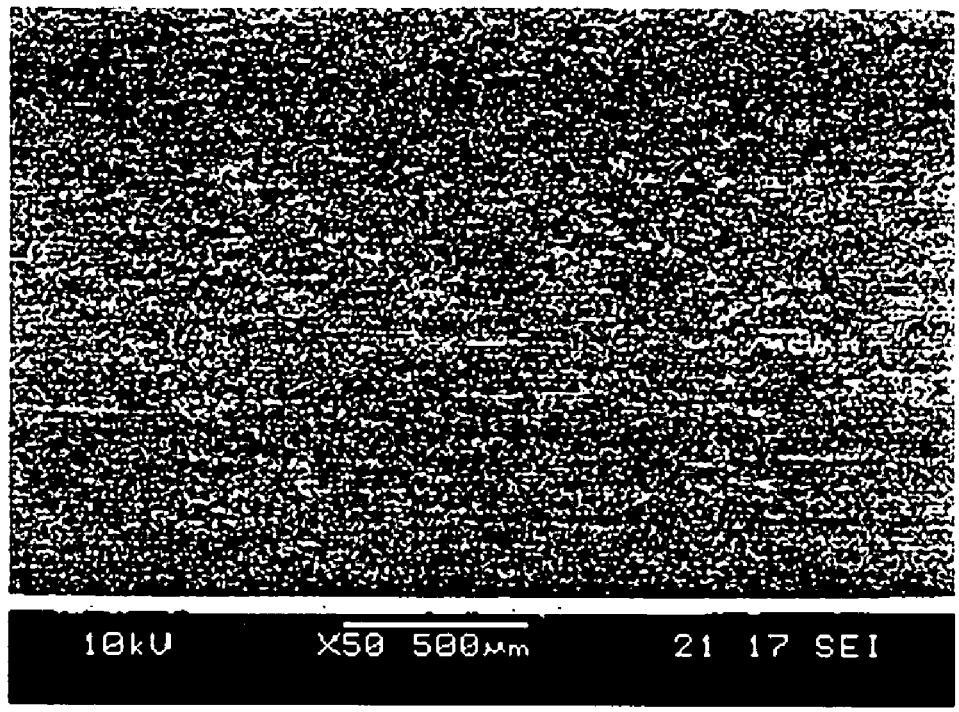
(B)
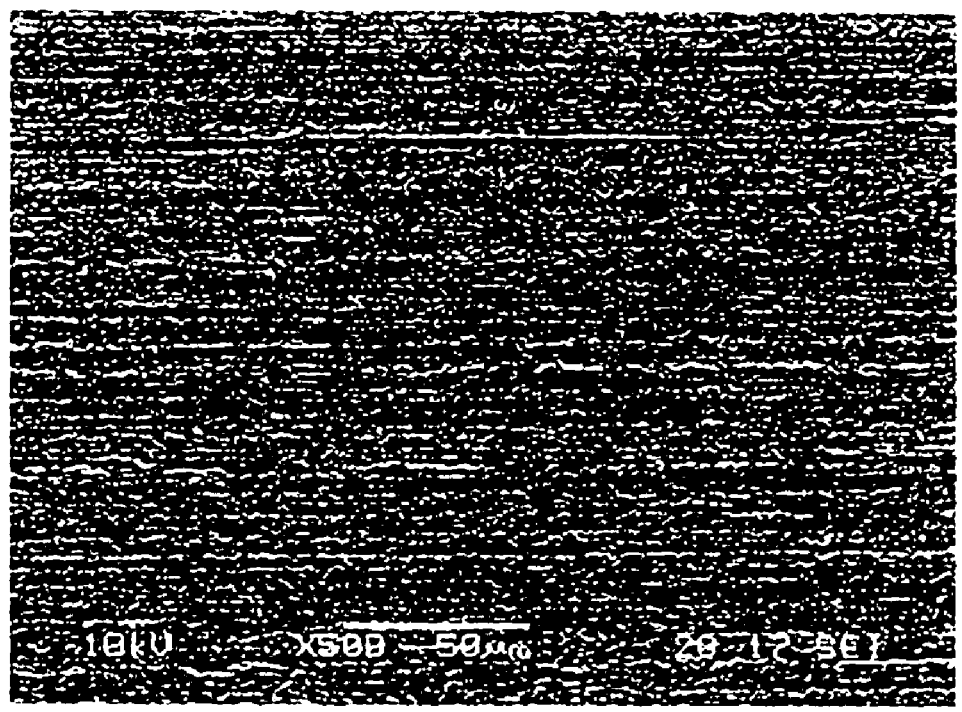

PACKAGING COMPONENT AND SEMICONDUCTOR PACKAGE

BACKGROUND OF THE INVENTION

1. Field of the Invention

The present invention relates to a packaging component and, more particularly, to a part and other elements for use in packaging. The packaging component is useful for the formation of packages having a structure obtained by mounting a semiconductor element or other elements on the packaging component and sealing the element-mounting portion with an insulating resin, and packages in which an adhesive layer is used as a bonding means. The packaging component includes, for example, a lead frame and a heat-radiating or -dissipating plate used in the production of an electronic device. The invention is further relates to a semiconductor package equipped with the packaging component of the present invention and other packages.

2. Description of Related Art

As is well known, there have been proposed a variety of semiconductor packages mounting a semiconductor element such as an IC chip or an LSI chip on a substrate such as a lead frame, and one of them includes a resin-sealed semiconductor package in which a semiconductor element is mounted and a portion mounting the semiconductor element is sealed with an insulating resin. The semiconductor packages as produced are usually stored, and are offered to end users, as required. The end users mount the semiconductor packages on substrates such as wiring boards by reflowing a solder to complete the final electronic devices.

Here, there arises a serious problem of deterioration of adhesion between the lead frame or another packaging component (e.g., heat-radiating plate) in the semiconductor package and the sealing resin. For example, the lead frame is usually made of copper or an alloy thereof and its surface is plated with nickel (Ni) to improve its corrosion resistance and heat resistance. An Ni-plated layer, usually, has a dense and smooth crystalline structure. However, as the Ni-plated layer has a low shearing strength at the interface, good adhesion cannot be maintained between the Ni-plated layer and the sealing resin.

The adhesion between the Ni-plated layer and the sealing resin tends to deteriorate with time. For example, as the semiconductor package is stored until it is mounted on a mounting substrate, the sealing resin can absorb the moisture in the air. As a result, the sealing resin can expand developing defects such as cracks and causing the semiconductor elements to be peeled. Specifically, the moisture absorbed by the sealing resin is rapidly vaporized and expanded due to the heat in the solder reflowing step (a temperature of as high as about 180 to 260° C. is used in this step) at the time of mounting the semiconductor package, producing a large stress in the sealing resin itself. As a result, cracks occur in the interface between the lead frame or the semiconductor element and the sealing resin, and the sealing resin peels off the lead frame. Such defects deteriorate the reliability of the semiconductor package. It has therefore been desired to provide a lead frame or any other packaging component that features excellent adhesion without any deterioration in adhesion.

The above deterioration in adhesion is not limited to the sealing resins only. The adhesive layer is, in many cases, used for bonding the semiconductor element and the packaging component, or between the packaging components. Therefore, the interposed adhesive layer can cause the same problem as in use of the sealing resin.

A keen study has been made in an attempt to solve the above-mentioned problems. For instance, the applicant of this application has invented a metallic insert member such as lead frame which is at least partly embedded in a resin, and in which the surface portion of the insert member embedded in the resin has a rough surface originated from a number of semispherical particles formed by plating (see, Japanese Unexamined Patent Publication (Kokai) No. 6-29439). The insert part is, desirably, a copper lead frame, and the plating, desirably, comprises a copper plating having a rough surface and an Ni plating or an Ni alloy plating formed thereon.

Further, as shown in FIG. 1, there has been proposed a method of forming a black oxide film on the lead frame to reinforce the adhesion to the sealing resin relying upon the anchoring effect (see, Japanese Unexamined Patent Publication (Kokai) No. 9-148509). The lead frame 101 that is illustrated is a press-molded article of copper or a copper alloy, and includes a chip-mounting portion 102, an internal lead portion 103, an external lead portion 104, and a wire-bonding portion 105. Silver layers 102a and 105a are plated on the upper surfaces of the chip-mounting portion 102 and the wire-bonding portion 105. Further, a circuit chip 106 is mounted on the chip-mounting portion 102. The circuit chip 106 and the wire-bonding portion 105 are connected together through a wire 107. Further, the lead frame 101, as a whole, is sealed with a sealing resin 108. In order to reinforce the adhesion between the lead frame 101 and the sealing resin 108 relying upon the anchoring effect, a black oxide film (cupric oxide CuO layer) 109 is formed on the limited portions where the silver layers 102a and 105a have not been plated. The black oxide film 109 is formed by anodizing the lead frame 101 in an organic alkali solution.

However, as modern semiconductor packages are produced in small sizes featuring higher functions, it has been desired to further improve the adhesion between the packaging component such as a lead frame or heat-radiating plate and the sealing resin or the adhesive layer and, at the same time, to prevent deterioration in the adhesion.

In addition to the above-mentioned resin-sealed semiconductor packages, a semiconductor package which has not been entirely covered with the sealing resin causes a new problem. One of the semiconductor packages of this kind is a semiconductor package called QFN (quad flat non-leaded) package. In this semiconductor package, the leads of the lead frame and the die pads are exposed from the surface of the sealing resin. That is, as schematically illustrated in FIG. 2 partly on an enlarged scale, the lead frame includes a conductor substrate 111 of copper and Ni-plated layers 112a and 112b plated on both surfaces thereof, and only the side mounting a semiconductor element (not shown) is covered with the sealing resin 119. Therefore, the Ni-plated layer 112a positioned on the outer side of the semiconductor package is exposed to the outside. Though not illustrated, the semiconductor package equipped with an externally exposed heat-radiating plate, too, is included in this type of semiconductor package.

In these semiconductor packages, portions of the packaging component exposed to the outside are causing a new problem. That is, the exposed portions tend to be scarred or stained while the semiconductor package is being handled, deteriorating the appearance and quality of the product, making the restoration difficult and, further, impairing the laser marking operation. According to the experience of the present inventors, most of the scars are caused by abrasion, scratching and holding, and stains are caused by chemicals and by fingerprints (skin fat), and none of them can be neglected. For reference, the occurrence of scars on the packaging components is described below with reference to FIGS. 3 and 4. Here, in order to confirm the occurrence of scars in the step of cutting after the plating, the reel-like copper lead frame was plated with a rough-surface Ni layer, cut into a sheet size for shipping, and a fixing tape was applied to secure the leads for suppressing dispersion of the leads. The surface state of the Ni-plated layer of the resulting lead frame was observed through a microscope (×50) to confirm a line, considered to be a scar due to abrasion, as illustrated in FIG. 3(A). The scar due to abrasion was further observed on an enlarged scale by using an electron microscope (×2,000) to confirm that the crystals had been crushed on the portion abraded by the metal mold as illustrated in FIG. 3(B). The same lead frame was further observed for its surface state of the Ni-plated layer of another portion using the microscope (×50) to confirm a scar presumably due to holding as illustrated in FIG. 4(A). The pattern of the scar was further observed on an enlarged scale using the electron microscope (×2,000) to confirm that the crystals had been crushed at a portion held by the metal mold as illustrated in FIG. 4(B). In this semiconductor package, too, the Ni-plated layer 112b has a smooth surface without solving the problem of insufficient adhesion between the sealing resin 119 and the Ni-plated layer 112b.

SUMMARY OF THE INVENTION

It is an object of the present invention to provide a packaging component such as a lead frame or a heat-radiating plate featuring excellent adhesion without deteriorating the adhesion.

Further, it is an object of the present invention to provide a packaging component featuring excellent adhesion, without deteriorating the adhesion, and without developing defects such as scars or stains.

Furthermore, it is an object of the present invention to provide a semiconductor package equipped with the packaging component featuring excellent adhesion without deteriorating the adhesion.

Furthermore, it is an object of the present invention to provide a semiconductor package equipped with a packaging component featuring excellent adhesion, without deteriorating the adhesion, and without developing defects such as scars or stains.

The above objects and other objects of the invention will be easily understood from the following detailed description.

In one aspect thereof, the present invention resides in a packaging component used for constituting a package mounting a semiconductor element or any other packages, having, on at least a portion of the surface thereof, a covered surface which is sealed or covered with an insulating resin or on which an adhesive layer is applied. The packaging component comprises a conductor substrate and an electrically conducting layer partly or entirely covering the surface thereof, and the electrically conducting layer comprises a rough-surface plated layer having a roughened surface profile on the covered surface.

In another aspect thereof, the present invention resides in a semiconductor package comprising at least one semiconductor element in combination with a packaging component of the invention.

BRIEF DESCRIPTION OF THE DRAWINGS

FIG. 3 is a set of microphotographs (A) and (B) showing the surface state of the roughened Ni-plated layer after the lead frame is cut into a sheet size;

FIG. 4 is a set of microphotographs (A) and (B) showing the surface state of the roughened Ni-plated layer after the lead frame is cut into a sheet size;

FIG. 20 shows a set of a scanning electron microphotograph (A) (SEM, ×10,000) of the surface state of a smooth surface Ni-plated layer (film thickness of 0.5 μm), a scanning electron microphotograph (B) (SEM, ×5,000) of the state in cross section thereof, and a surface analysis diagram (C) using an atomic force microscope (AFM, 10 μm$^2$);

FIG. 24 is a set of microphotographs (A) and (B) showing the surface state of the smooth surface Ni-plated layer after the lead frame is cut into a sheet size;

FIG. 25 is a set of microphotographs (A) and (B) showing the surface state of the smooth surface Ni-plated layer after the lead frame is cut into a sheet size;

DESCRIPTION OF THE PREFERRED EMBODIMENTS

Figure 1:
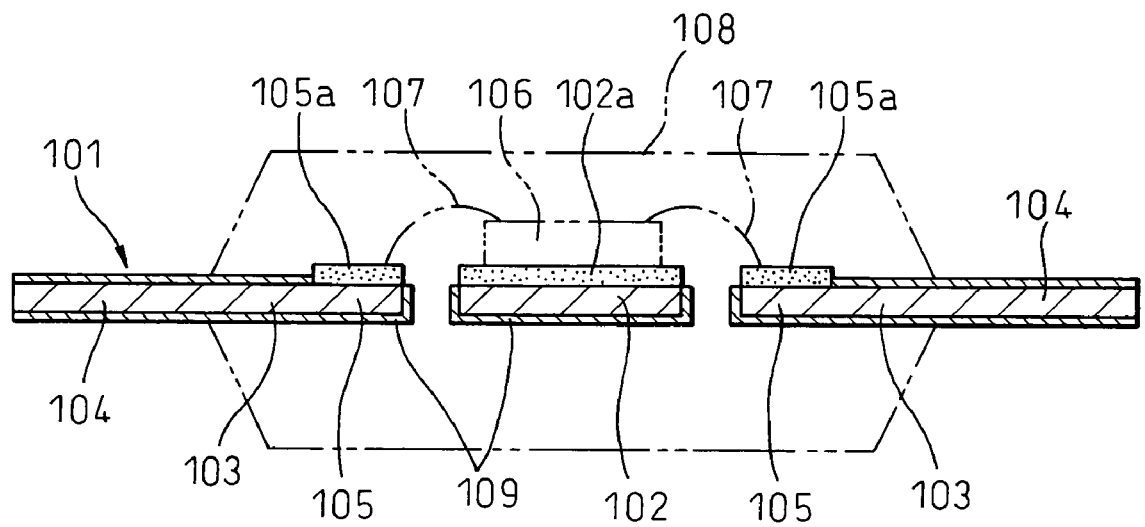
FIG. 1 is a sectional view illustrating a conventional air-tightly sealed semiconductor package.
Figure 2:
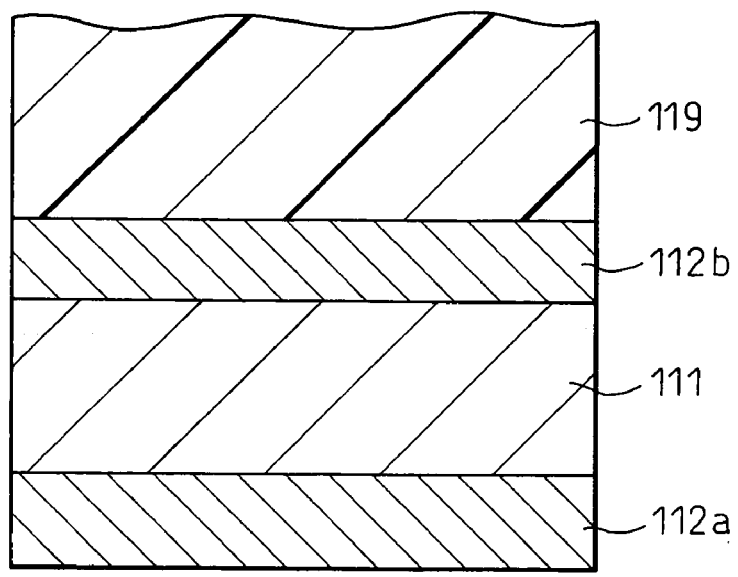
FIG. 2 is a sectional view illustrating a portion of the conventional air-tightly sealed semiconductor package.

The present invention is concerned with a packaging component used for constituting a package mounting a semiconductor element thereon, i.e., semiconductor package or any other packages. There is no particular limitation on the kind, numbers and mounting sites of the semiconductor element incorporated in the semiconductor package. For example, the semiconductor element includes a semiconductor chip such as IC chip or LSI chip. The semiconductor element may be mounted alone or, alternatively, as required, there may be mounted two or more semiconductor elements in any combination. Further, there may be mounted any active element or passive element instead of the semiconductor element or in combination with the semiconductor element.

The packaging component of the present invention can be also advantageously applied to packages other than the semiconductor packages. Other packages suitable in the practice of the present invention include glass terminals, i.e., glass-to-metal seals.

In the semiconductor packages and other packages, it is essential that the packaging component is sealed by the insulating resin or has at least a covered surface to which an adhesive layer is applied. This is because the packaging component of the present invention is characterized in that the adhesion is improved relative to the insulating resin or to the adhesive layer due to the presence of a rough-surface plated layer, as will be described below in detail.

There is no particular limitation on the packaging component so far as it exhibits the action and effect of the invention when it is used. A suitable packaging component includes those widely used for the production of semiconductor packages and other packages, typically, a lead frame, a heat-radiating or -dissipating plate, etc. The packaging component may be used alone or in a combination of two or more components. For example, a semiconductor chip is mounted on the lead frame, and the heat-radiating plate is further attached, onto the semiconductor chip, while adhering the plate to the chip.

The packaging component according to the invention comprises a conductor substrate and an electrically conducting layer covering the surfaces thereof. The electrically conducting layer may cover a whole surface of the conductor substrate or may partly cover only the required portions of the surface.

In the packaging component of the invention, the conductor substrate may be formed from various materials depending upon the constitution of the packaging component or the required characteristics. Suitable materials for forming the conductor substrate may include, for example, copper or an alloy or a compound thereof, as well as an alloy or compound of a metal other than copper (a non-copper metal), though the material of the conductor substrate is in no way limited thereto. Examples of the non-copper metal include aluminum, iron-nickel alloy, etc. When the packaging component is a lead frame, for example, copper or an alloy thereof can be advantageously used as the conductor substrate, because they have excellent electric conduction and can be easily worked. When the packaging component is a heat-radiating plate, it is desired that the conductor substrate exhibits excellent heat conduction and heat radiation. Therefore, copper, aluminum or an alloy thereof can be advantageously used as the conductor substrate.

The electrically conducting layer may be formed from the same material as the conductor substrate or may be formed from any other materials. The electrically conducting layer is usually formed as a single layer. As required, however, it may be formed as a multi-layer structure having two or more layers. Desirably, the electrically conducting layer is formed as a plated layer by using a plating method. As required, however, it may be formed by a thin-film forming technology other than the plating method, such as vacuum evaporation or sputtering.

In the case of the packaging component of the invention, the electrically conducting layer covering the conductor substrate must at least partly have a rough-surface plated layer having a roughened surface profile. The rough-surface plated layer usually has a lusterless surface. There is no particular limitation on the portion of the packaging component on where the rough-surface plated layer is formed. When the semiconductor package or any other package is sealed with an insulating resin, however, the above portion is, typically, a portion to where the sealing resin is applied or a portion to where an adhesive layer is applied by applying an adhesive or by sticking an adhesive tape for bonding the packaging components or for the element bonding. In the present invention, these portions are particularly referred to as "covered surfaces". In the case of the packaging component of the invention, further, the portion where the sealing resin or the adhesive layer needs not be applied is referred to as an "uncovered surface". That is, the portion where the packaging component of the semiconductor package or of any other package is exposed to the outer side is referred to as an "uncovered surface" so as to be distinguished from the covered surface of the packaging component.

The rough-surface plated layer of the electrically conducting layer may be formed by a method other than the plating method, as required, but is advantageously formed by the plating method from the standpoint of ease and cost. In particular, an electroplating method can be advantageously used. Though not limited to those listed below, preferred metals to be plated includes nickel, copper, palladium, gold, silver, tin, chromium or an alloy thereof.

A plating bath used for forming the rough-surface plated layer may be arbitrarily modified depending upon the kind of the layer to be plated. When, for example, the rough-surface plated layer is to be formed by using nickel, there can be advantageously used a nickel chloride plating bath. For example, the nickel chloride plating bath suited in the practice of the invention may have the following composition.

| Nickel chloride | 75 g/L |
| Sodium thiocyanate | 15 g/L |
| Ammonium chloride | 30 g/L |
| pH | 4.5 to 5.5 |

The above nickel chloride plating bath can be used under, for example, the following conditions.

| Bath temperature | normal temp. (about 25° C.) |
| Treatment time | about 15 sec. to about 30 min. |
| Cathode current density | about 1 to 3 A/cm$^2$ |

The rough-surface plated layer may be formed at different thicknesses. The thickness of the rough-surface plated layer varies depending upon the constitution (single layer or multiple layers) of the plated layer and the properties required for the plated layer, but is, usually, in the range of about 0.2 to 50 μm and, preferably, in the range of about 0.3 to 10 μm. In the practice of the invention, there is no particular limitation on the thickness of the rough-surface plated layer.

In the packaging component of the invention, the rough-surface plated layer formed as the electrically conducting layer can be formed on various portions of the packaging component as described above.

In one aspect of the invention, it is desired that substantially the whole surface of the packaging component is occupied by the covered surface that comprises a rough-surface plated layer having a roughened surface profile. Such a packaging component is preferably and typically a lead frame used for the production of a semiconductor package. In this semiconductor package, for example, one or more semiconductor elements can be mounted on a predetermined position of the lead frame, and the lead frame can substantially be entirely sealed with the insulating resin. Note that, in this semiconductor package, the externally exposed heat-radiating plate that is partly exposed to the outer side may also be used along with the lead frame.

In another aspect of the invention, the packaging component may have, on the surface thereof, both a covered surface and an uncovered surface. The uncovered surface is a particular surface of the surface of the packaging component that is exposed to the outer side in the absence of the insulating resin and/or the adhesive layer. In this case, how to use the covered surface and the uncovered surface on the surface of the packaging component can be arbitrarily varied depending upon the kind and the object of use of the packaging component. When a plurality of packaging components are used, the selection is further diversified.

For example, when a semiconductor package is to be produced by sealing the lead frame as a packaging component with the resin, a portion of the lead frame is exposed to the outer side, and this exposed surface of the lead frame becomes the "uncovered surface" which is specifically referred to in the present invention. The surface of the lead frame on the side of mounting the element is in a state of being sealed with the insulating resin, and becomes the "covered surface" which is also specifically referred to in the present invention.

When the packaging component is a heat-radiating plate, the surface of the heat-radiating plate is at least partly exposed to the outer side, and this exposed portion becomes the uncovered portion.

Further, when the semiconductor element is mounted on the wiring board and the cover-like heat-radiating plate is bonded to the wiring board through an adhesive layer, the bonding surface of the heat-radiating plate becomes the covered surface and the surface of the heat-radiating plate exposed to the outer side becomes the uncovered surface.

In the packaging component of the invention having both the covered surface and the uncovered surface as described above, the uncovered surface may have a rough-surface plated layer which is the same as, or similar to, the covered surface as required but, preferably, has, as the electrically conducting layer, a smooth-surface plated layer having a smooth surface profile. The smooth-surface plated layer is, usually, lustrous or matte, i.e., semi-lustrous. The smooth-surface plated layer in the uncovered surface can be formed by plating a metal which is the same as, or different from, that of the rough-surface plated layer in the covered surface. Though not limited to those described below, a preferred metal to be plated is, for example, nickel, copper, palladium, gold, silver, tin, chromium or an alloy thereof.

The smooth-surface plated layer may be formed by a method other than the plating method as required, but is advantageously formed by the plating method from the standpoint of ease and cost. In particular, an electroplating method can be advantageously used. The plating bath used herein can be arbitrarily modified depending upon the kind of the plated layer. For example, when the smooth-surface plated layer is formed by using nickel, there can be advantageously used a nickel sulfamate plating bath, a Watts nickel plating bath, a nickel bromide plating bath or a Wood's nickel plating bath. For example, the nickel sulfamate plating bath suited for the practice of the invention may have the following composition.

| | |
|---|---|
| Nickel sulfamate | 320 g/L |
| Boric acid | 30 g/L |
| Nickel bromide | 10 g/L |
| pH | 3.0 to 4.0 |

The above nickel plating bath can be used under, for example, the following conditions.

| | |
|---|---|
| Bath temperature | about 30 to 50° C. |
| Treatment time | about 15 sec. to about 30 min. |
| Cathode current density | about 3 to 30 A/cm$^2$ |

The smooth-surface plated layer in the uncovered surface may be formed at any desired thickness as in the formation of the rough-surface plated layer in the covered surface. The thickness of the smooth-surface plated layer varies depending upon the constitution (single layer or multiple layers) of the plated layer and the properties required for the plated layer, but is, usually, in the range of about 0.2 to 50 μm and, preferably, about 0.3 to 10 μm. In the practice of the invention, there is no particular limitation on the thickness of the smooth-surface plated layer.

Specifically, in the packaging component of the present invention, the rough-surface plated layer in the uncovered surface of the conductor substrate may have various roughened states as a surface profile. According to the results observed by the present inventors by using an electron microscope, a particularly preferred roughened state is a needle-like crystalline structure of the plating metal. Namely, as will be described below with reference to the accompanying electron microphotographs, there exist numerous needle-like projections having sharp ends due to the plated metal on the surface of the plated rough-surface layer in the covered surface of the conductor substrate, and the projections are playing the role of anchors to the sealing resin and to the adhesive layer. The needle-like projections may have any shape, and typically the shape is a triangular cone, an aventurine or a feather. It is, generally, desired that the needle-like projections are distributed on the whole surface of the covered surface. If desired effects are obtained, however, the needle-like projections may be to simply occupy a substantial portion (e.g., about 80% or more) of the covered surface. Further, the projections need not all be of a needle shape. Depending upon the cases, some of the projections may have rounded ends without being sharpened provided the desired effect is obtained. This is because, owing to its shape, the needle-like crystalline structure of the plated metal offers an anchoring effect in addition to increasing the bonding area.

The rough-surface plated layer may have a single-layer structure having the above-mentioned plated layer only or may have a multi-layer structure having two or more plated layers. Examples of the rough-surface plated layer having a multi-layer structure, though not restricted to, include:

(1) a combination of an underlying plated layer (e.g., smooth-surface plated layer) and a rough-surface plated layer formed in this order on the conductor substrate;

(2) a combination of a rough-surface plated layer and a surface plated layer formed in this order on the conductor substrate; and (3) a combination of an underlying plated layer (e.g., smooth-surface plated layer), a rough-surface plated layer and a surface plated layer formed in this order on the conductor substrate.

In the multi-layer structure (1), the rough-surface layer may be referred to as "surface plated layer". Note that the underlying plated layer may or may not exist, but when it exists, it may utilize the smooth-surface plated layer formed in the uncovered layer from the standpoint of decreasing the number of process steps and cost.

When the surface plated layer is to be used in combination with other layer or layers, it is desired that the surface plated layer is used so as to reproduce the roughened surface profile specific to the rough-surface plated layer. In other words, the surface plated layer should not be formed in such a thickness that it completely covers the surface (rough surface) of the electrically conducting layer, thereby forming a flat or smooth surface.

It is desired that the surface plated layer is usually formed by plating a metal selected from the group consisting of gold, silver, copper, palladium, nickel, tin, chromium or an alloy thereof. If comparable functions and effects are obtained, however, the surface plated layer may be formed by any method other than plating. It is recommended to form a rough-surface plated layer by oxidizing the underlying plated layer. For example, the surface plated layer may be formed in the form of an oxidized plated layer (oxide film) by oxidizing the underlying rough-surface plated layer. Desirably, the oxide film is formed by thermally oxidizing, or chemically and/or electrochemically oxidizing the surface of the rough-surface plated layer. Alternatively, in the case of the rough-surface plated layer (surface plated layer) of the above multi-layer structure (1), the surface can be roughened by oxidizing the underlying plated layer through blackening or black oxide treatment and the like. The blackening treatment is a conversion treatment for chemically forming an oxide film on a surface of copper or an alloy thereof.

The invention is further concerned with a semiconductor package or any other packages equipped with the packaging component of the invention. The invention is particularly concerned with a semiconductor package having at least one semiconductor element in combination with the packaging component of the invention. As described above, the semiconductor element includes a semiconductor chip such as IC chip or LSI chip, as well as any other element.

In the semiconductor package of the invention, the packaging component is preferably a lead frame. In the semiconductor package, it is desired that a semiconductor element is mounted on a predetermined position of the lead frame and that the element mounting portion is further sealed with an insulating resin. It is further desired that the semiconductor package is the resin-sealed type semiconductor package in which the lead frame is substantially entirely sealed with the insulating resin. The resin-sealed type package may further has an externally exposed heat-radiating plate of which the surface is partly exposed to the outer side.

As the semiconductor package in which the packaging component is a lead frame, there can be advantageously employed a package in which part of the lead frame is exposed to the outer side. A typical example of this package is a QFN (guad flat non-leaded) package.

Further, the semiconductor package includes a semiconductor package of which the packaging component is a heat-radiating or -dissipating plate. As in the above cases, it is also essential that the surface of the heat-radiating plate is partly exposed to the outer side from the insulating resin.

There is also another semiconductor package of which the packaging component is the heat-radiating plate. This semiconductor package is a semiconductor package in which the semiconductor element is mounted on a wiring board, and the heat-radiating plate is bonded to the wiring board via an adhesive layer.

As described above, the packaging component and the semiconductor package of the present invention can be advantageously carried out in a variety of embodiments. The invention will now be specifically described with reference to the accompanying drawings. The invention, however, is not limited to the following embodiments only.

Figure 5:
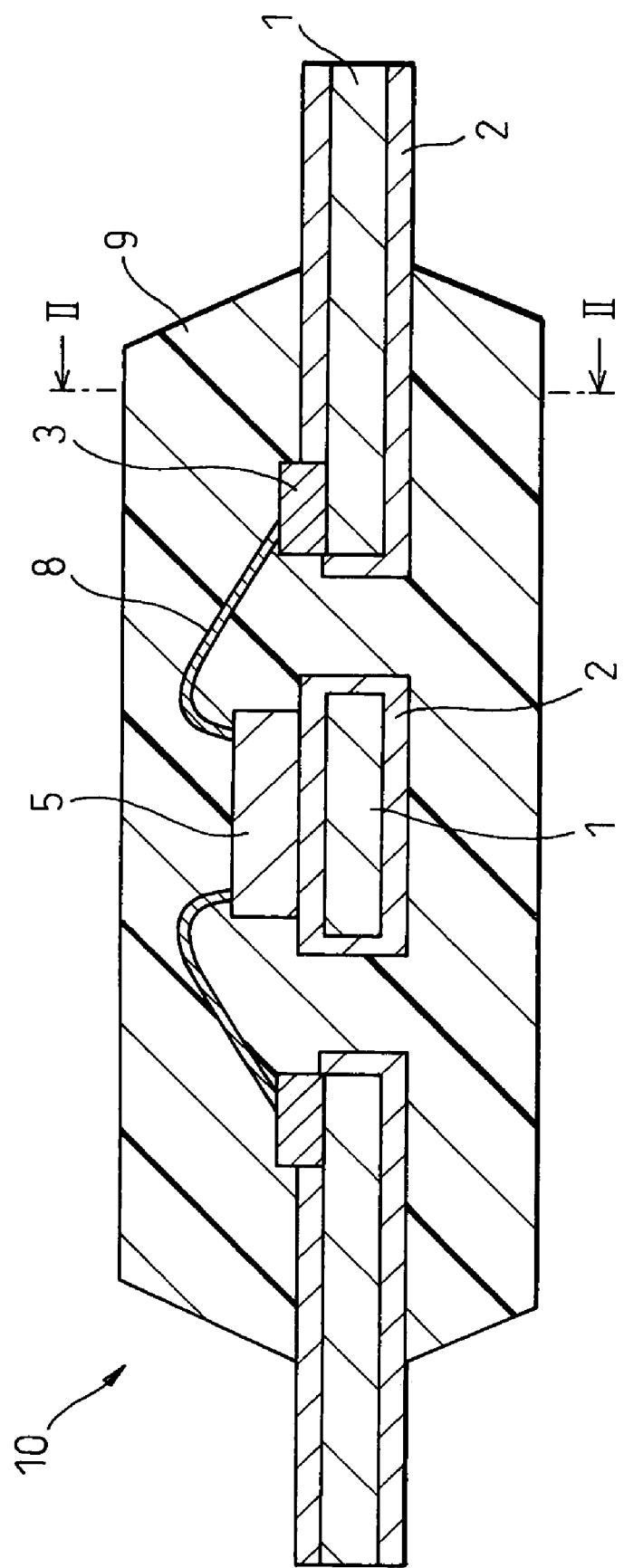
FIG. 5 is a sectional view illustrating a preferred embodiment of a semiconductor package according to the present invention.

FIG. 5 is a sectional view of a semiconductor package using a lead frame (conductor substrate) as a packaging component of the present invention. In the illustrated semiconductor package 10, the lead frame 1 may be substantially made of copper or an alloy thereof, or may be made of substantially a non-copper metal, and the outermost layer thereof may be made of copper or an alloy thereof. In the latter case, the non-copper alloy may be, for example, an iron-nickel (FeNi) alloy, and in such a case, the outermost layer may be formed by a plating method or by any other film-forming method by using copper or an alloy thereof. The lead frame is usually produced by purchasing a conductor substrate in the form of a thin plate, and machining it into the shape of a lead frame by press working or etching. The lead frame 1 has an electrically conducting layer (an Ni-plated layer is used herein) 2 formed on the surface thereof. As shown, the electrically conducting layer 2 is formed so as to substantially cover the outer periphery of the lead frame 1. The lead frame 1 has a silver-plated layer 3 for wire bonding. In the case of the illustrated semiconductor package 10, though not shown, a heat spreader may be arranged in combination with the lead frame 1 to obtain higher heat-radiating performance, and in such a case, to enhance the adhesion at the time of sealing the heat spreader with an insulating resin 9, the rough-surface plated layer of the invention can be advantageously applied to the surface of the heat spreader.

A semiconductor element 5 is mounted on a predetermined position of the lead frame 1. Though not illustrated, the lead frame 1 and the semiconductor element 5 are bonded together, usually, by using a bonding medium such as an adhesive sheet, die-bonding material, etc. The semiconductor element 5 is, for example, an IC chip or an LSI chip. In the illustrated embodiment, only one semiconductor element 5 is mounted. However, two or more semiconductor elements may be mounted, if desired. Further, any active element or passive element may be mounted in place of the semiconductor element or in combination with the semiconductor element. That is, in this embodiment, there is no particular limitation on the kinds of the semiconductor element and others.

In the semiconductor element 5, its external connection terminal (not shown) is connected to the silver-plated layer 3 of the lead frame 1 through the bonding wire 8. The bonding wire 8 is a fine wire of, for example, gold (Au) or aluminum (Al). As required, further, the electric connection may be accomplished by using a flip chip (FC) bonding method in place of the illustrated wire bonding method.

In the semiconductor package 10 illustrated in FIG. 5, substantially the whole portion of the lead frame 1, i.e., the functional unit of the semiconductor package, inclusive of the portion mounting the semiconductor element 5, is sealed with the insulating resin 9, and both ends of the lead frame 1 are exposed, i.e., the external lead portions only are exposed. Namely, in the case of the illustrated semiconductor package 10, the whole lead frame 1 substantially constitutes the "(resin-)covered surface" that is referred to in the present invention. The sealing resin 9 works to protect the semiconductor package 10 from the external moisture or shocks, and includes any insulating resin so far as it does not impair the functions and effects of the invention. Though not limited thereto only, suitable examples of the sealing resin include epoxy resin, polyimide resin, phenol resin and vinyl chloride resin.

Figure 6:
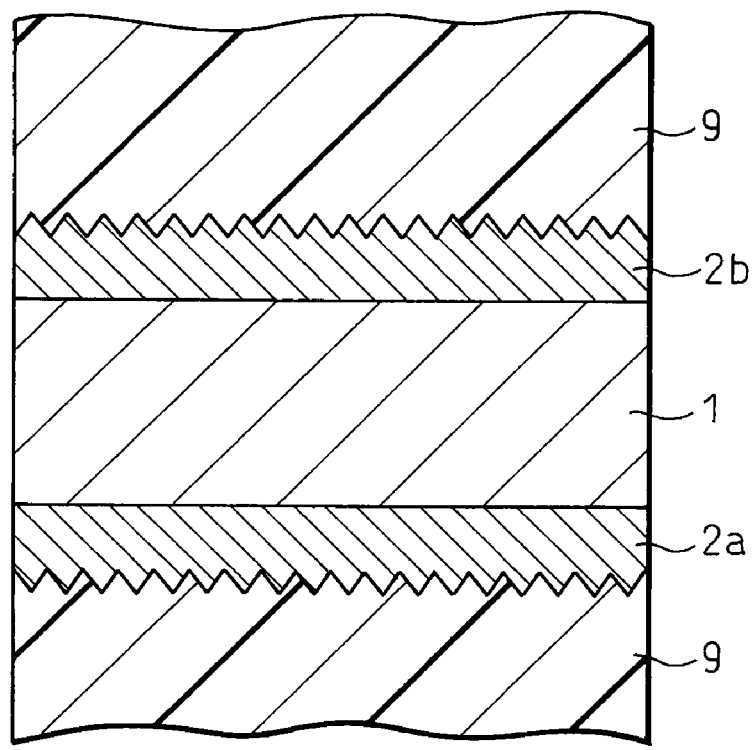
FIG. 6 is a sectional view illustrating, on an enlarged scale, the constitution of a lead frame of the present invention used in the semiconductor package of FIG. 5.
Figure 7:
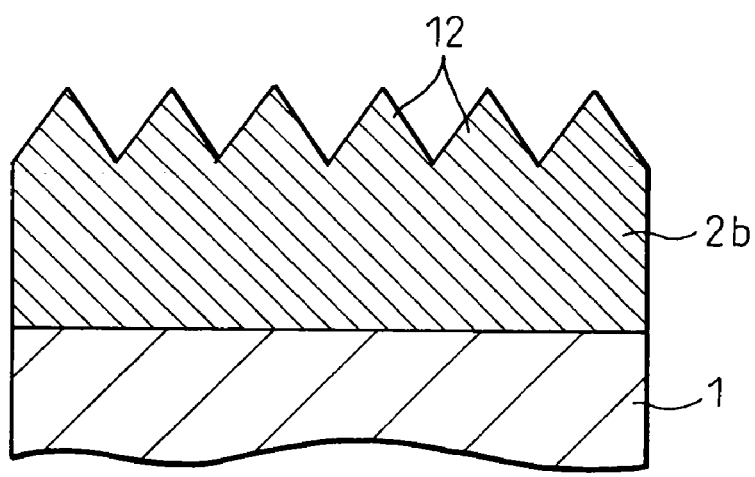
FIG. 7 is a sectional view illustrating the formation of a rough surface plated layer on the lead frame of the present invention.

As will be understood from FIG. 6 which is a partly enlarged view along the line II—II of FIG. 5, the electrically conducting layer (Ni-plated layer) 2 of the lead frame 1 has a roughed surface profile on the side of the sealing resin 9. Namely, as is illustrated in FIG. 7 on an enlarged scale, the lead frame 1 and the upper electrically conducting layer (rough-surface plated layer; Ni-plated layer) 2b, the rough-surface plated layer 2b has needle-like projections 12 with sharp ends in a random fashion. It is desired that the needle-like projections 12 are distributed without interruption on the surface of the rough-surface plated layer 2b. In order to reliably increase the interfacial shearing strength based on an increased bonding area and on the enhanced anchoring effect, further, it is desired that the needle-like projections 12 are not distributed extremely randomly. It is desired that the needle-like projections 12 formed in a triangular shape in cross section, usually, have a nearly constant height which is in a range of about 0.2 to 3 μm though it may vary depending upon the constitution of the rough-surface plated layer 2b or the plating conditions. It is further desired that the surface roughness Ra representing the height of the needle-like projections 12 is not smaller than about 50 nm. In the illustrated embodiment, the electrically conducting layer (rough-surface plated layer) 2 is formed directly on the surface of the lead frame 1. As required, however, any underlying layer such as a plated layer may be interposed between the lead frame 1 and the electrically conducting layer 2.

Figure 8:
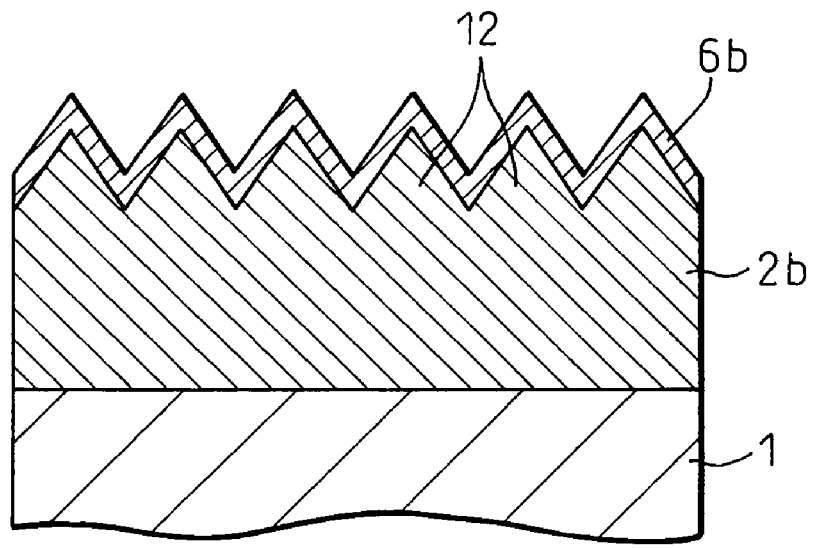
FIG. 8 is a sectional view illustrating the formation of a surface plated layer on the lead frame of the present invention.

It is desired that the rough-surface plated layer 2 formed as the electrically conducting layer in the covered surface of the lead frame 1 further has an additional layer formed thereon. The preferred additional layer may be a surface layer illustrated in FIG. 8, preferably, a surface plated layer 6b. Though only one surface layer is illustrated, if formed, the surface plated layer is usually formed on both the front and back surfaces (as well as on the side surfaces) of the lead frame 1, as can be understood from FIG. 6. The thickness of the surface plated layer may be varied over a wide range depending upon the desired effect but is usually in the range of about 0.005 to 1 μm and, preferably, in the range of about 0.01 to 0.05 μm.

It is necessary that the surface plated layer exactly reproduces the profile of needle-like projections 12 of the underlying rough-surface plated layer 2b, and is desirably formed by a plating method suited for reproducing the projections and at a plating thickness necessary therefor. The surface plated layer can be advantageously formed by, for example, the plating method using gold, silver, copper, palladium, nickel, tin, chromium or an alloy thereof. The plating method can be carried out in accordance with the conventional methods.

Alternatively, the rough-surface plated layer may be thermally, chemically and/or electrochemically oxidized to form the desired surface plated layer. There is no particular limitation on the oxidation method for forming the surface plated layer, and the oxidation method includes a blackening or black oxide treatment method using a blackening treatment solution. The blackening treatment solution contains a strong alkaline compound and an oxidizing agent as its main components, and may have, for example, the following composition.

| Sodium chlorite ($NaClO_2$) | 5 to 100 g/L |
| Sodium hydroxide (NaOH) | 5 to 60 g/L |
| Trisodium phosphate ($Na_3PO_4$) | 0 to 200 g/L |

The blackening treatment solution can be used under, for example, the following treatment conditions.

| Bath temperature | about 50 to 100° C. |
| Treating time | about 5 sec. to 5 min. |
| Current density | about 0 to 10 A/dm$^2$ |

The semiconductor package according to the present invention includes semiconductor packages other than the semiconductor package 10 described above with reference to FIG. 5. The semiconductor package of the present invention may have various embodiments within the scope of the invention, and typical examples will now be described with reference to FIGS. 9, 12 and 13.

Figure 9:
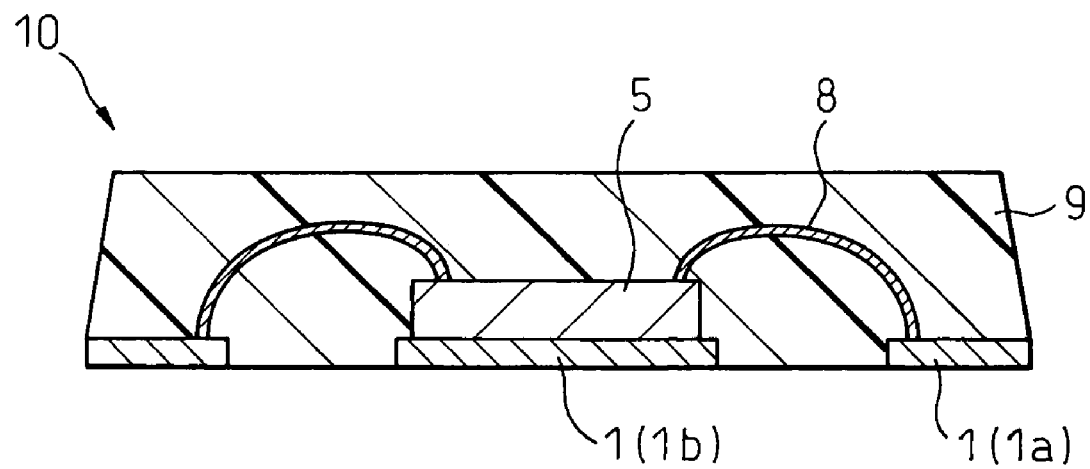
FIG. 9 is a sectional view illustrating a preferred embodiment of the semiconductor package according to the present invention.

FIG. 9 is a sectional view illustrating a preferred embodiment of a semiconductor package according to the present invention. The illustrated semiconductor package 10 is called a QFN (quad flat non-leaded) package, and has the external lead 1a of the lead frame 1 and the back surface of the die pad 1b exposed from the surface of the sealing resin 9. That is, the lead frame 1 possesses both the uncovered surface exposed to the outer side as well as the covered surface in contact with the sealing resin 9. The semiconductor element 5 mounted on the die pad 1b has the external connection terminal (not shown) connected to the silver-plated layer (not shown) of the external lead 1a through a bonding wire (Au wire) 8.

Figure 10:
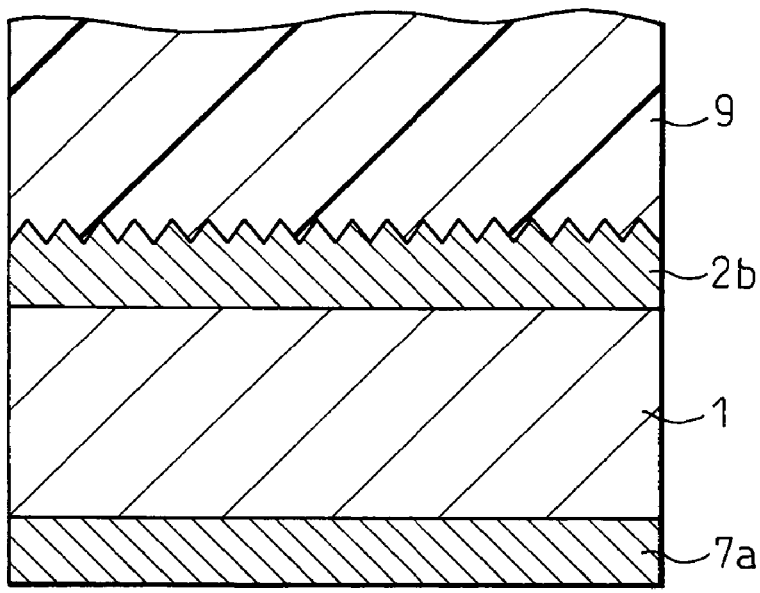
FIG. 10 is a sectional view illustrating, on an enlarged scale, the constitution of the lead frame of the present invention used in the semiconductor package of FIG. 9.

In the case of the illustrated QFN package 10, the lead frame 1 has a constitution that is schematically illustrated in FIG. 10. The lead frame 1 is a conductor substrate of copper and has a rough-surface plated layer (Ni-plated layer here) 2b, described above, at a predetermined thickness on the surface of the side of the sealing resin 9. Further, a smooth-surface plated layer (Ni-plated layer is formed herein) 7a is formed at a predetermined thickness on the surface of the lead frame 1 at a position on the outer side of the QFN package 10.

Figure 11:
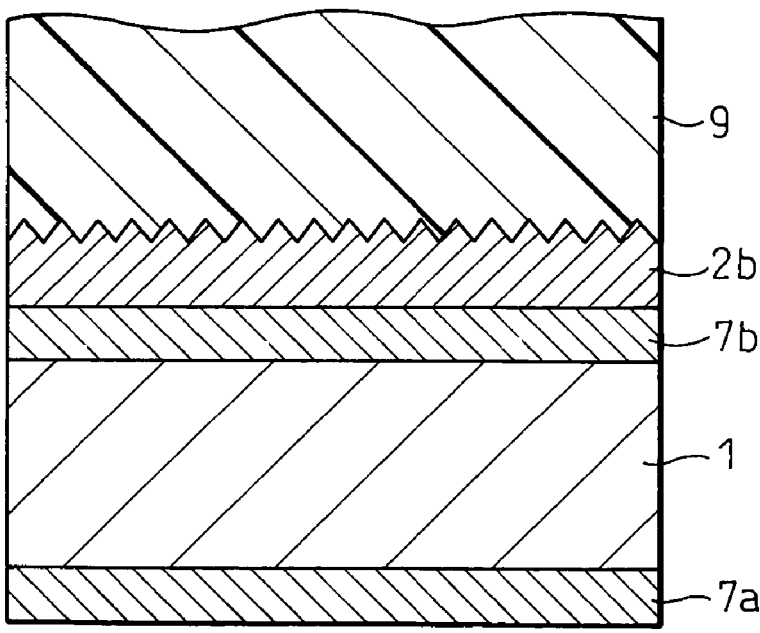
FIG. 11 is a sectional view illustrating, on an enlarged scale, the constitution of another lead frame of the present invention which can be used in the semiconductor package of FIG. 9.

In the QFN package 10 illustrated in FIG. 9, another lead frame schematically illustrated in FIG. 11 may be used in place of the lead frame 1 illustrated in FIG. 10. A feature resides in that the illustrated lead frame 1 has the smooth-surface plated layer 7b which is the same as the smooth-surface plated layer 7a on the side of the sealing resin 9, too. That is, in the case of the QFN package 10, the smooth-surface plated layers 7a and 7b are formed on both surfaces of the lead frame 1, and the rough-surface plated layer (Ni-plated layer) 2b can be selectively formed on only one surface thereof.

Figure 12:
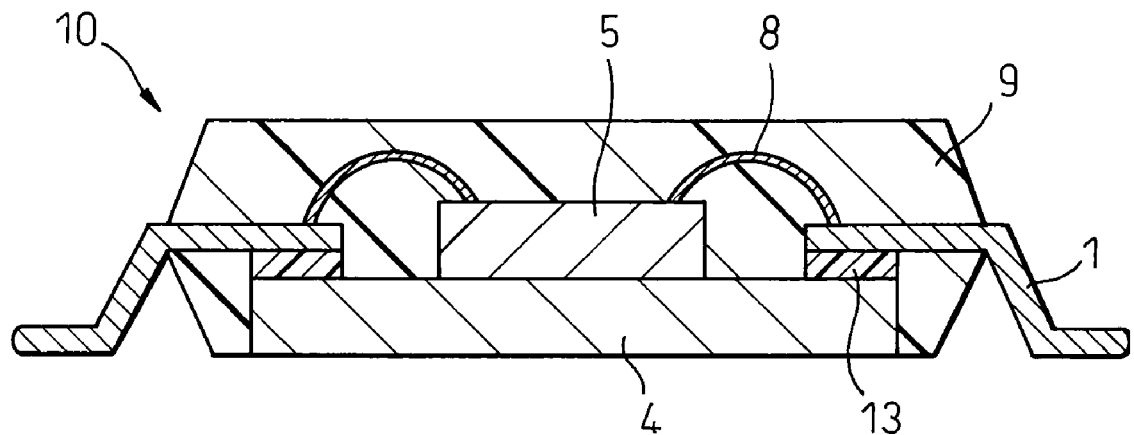
FIG. 12 is a sectional view illustrating another preferred embodiment of the semiconductor package according to the present invention.

FIG. 12 is a sectional view illustrating another preferred embodiment of the semiconductor package according to the invention. In the illustrated semiconductor package 10, a heat-radiating aluminum plate (also called heat sink) 4 is bonded to the lead frame 1 through an adhesive tape 13, and the semiconductor element 5 is mounted on the heat-radiating plate 4. The heat-radiating plate 4 can be made of copper or any other highly heat conducting metallic material, in addition to aluminum. The semiconductor element 5 mounted on the heat-radiating plate 4 has an external connection terminal (not shown) that is connected to the silver-plated layer (not shown) of the lead frame 1 via the bonding wire (Au wire) 8.

In the illustrated semiconductor package 10, except for external terminal 1', substantially the whole surface of the lead frame 1 and one surface of the heat-radiating plate 4 are sealed with the sealing resin 9. Therefore, only the back surface of the heat-radiating plate 4 is exposed from the surface of the sealing resin 9. Namely, in this semiconductor package 10, the present invention can be applied not only to the lead frame 1 but also to the heat-radiating plate 4. This is because the lead frame 1 has surface portion to be covered with the sealing resin 9 and the heat-radiating plate 4 has a surface 4a exposed to the outer side as well as surface portion 4b recovered by the sealing resin 9. The rough-surface layer is plated on the surface portions 1a, 1b of the lead frame 1 and on the surface portion 4b the heat-radiating plate 4 according to the present invention, and a smooth-surface layer is plated on the exposed surface 4a of the heat-radiating plate 4, according to the present invention.

Figure 13:
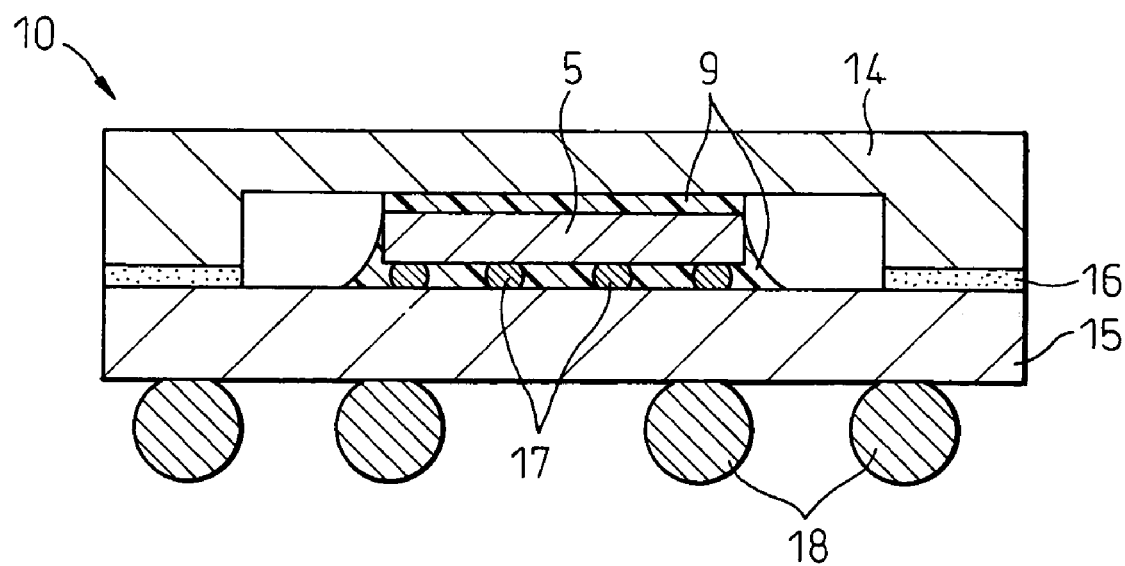
FIG. 13 is a sectional view illustrating a still another preferred embodiment of the semiconductor package according to the present invention.

FIG. 13 is a sectional view illustrating another preferred embodiment of the semiconductor package according to the present invention. In this illustrated semiconductor package 10, the semiconductor element 5 is bonded through flip chips (FC) onto a circuit board 15 via gold (Au) bumps 17, and is sealed with the sealing resin 9. Further, solder balls 18 are mounted as external connection terminals on the circuit board 15. To radiate the heat of the semiconductor element 5, further, a heat-radiating plate (also called a heat slug) 14 made of copper or a copper alloy is bonded to the back surfaces of the circuit board 15 and of the semiconductor element 5. As illustrated, the heat-radiating plate 14 has a recessed portion 14a for accommodating the semiconductor element 5. The heat-radiating plate 14 and the circuit board 15 are bonded together and respective, facing surfaces 14a and 15a by an adhesive layer (polyimide tape) 16, and the present invention can be applied to these bonding surfaces 14aand 15a. Namely, the respective bonding surfaces 14aand 15a of the heat-radiating plate 14 and of the circuit board 15 are the covered surfaces on each of which a rough-surface layer is plated (not shown) according to the invention. Further, the outer surface of the heat-radiating plate 14 is an uncovered surface on which a smooth-surface layer is plated.

In the practice of this invention, the electrically conducting layer of the packaging component can be advantageously formed by the plating method as described above and, more preferably, by the electroplating method. When the rough-surface plated layer and the smooth-surface plated layer are to be formed by the electroplating method, the conventional plating method and plating apparatus can be arbitrarily used.

Figure 14:
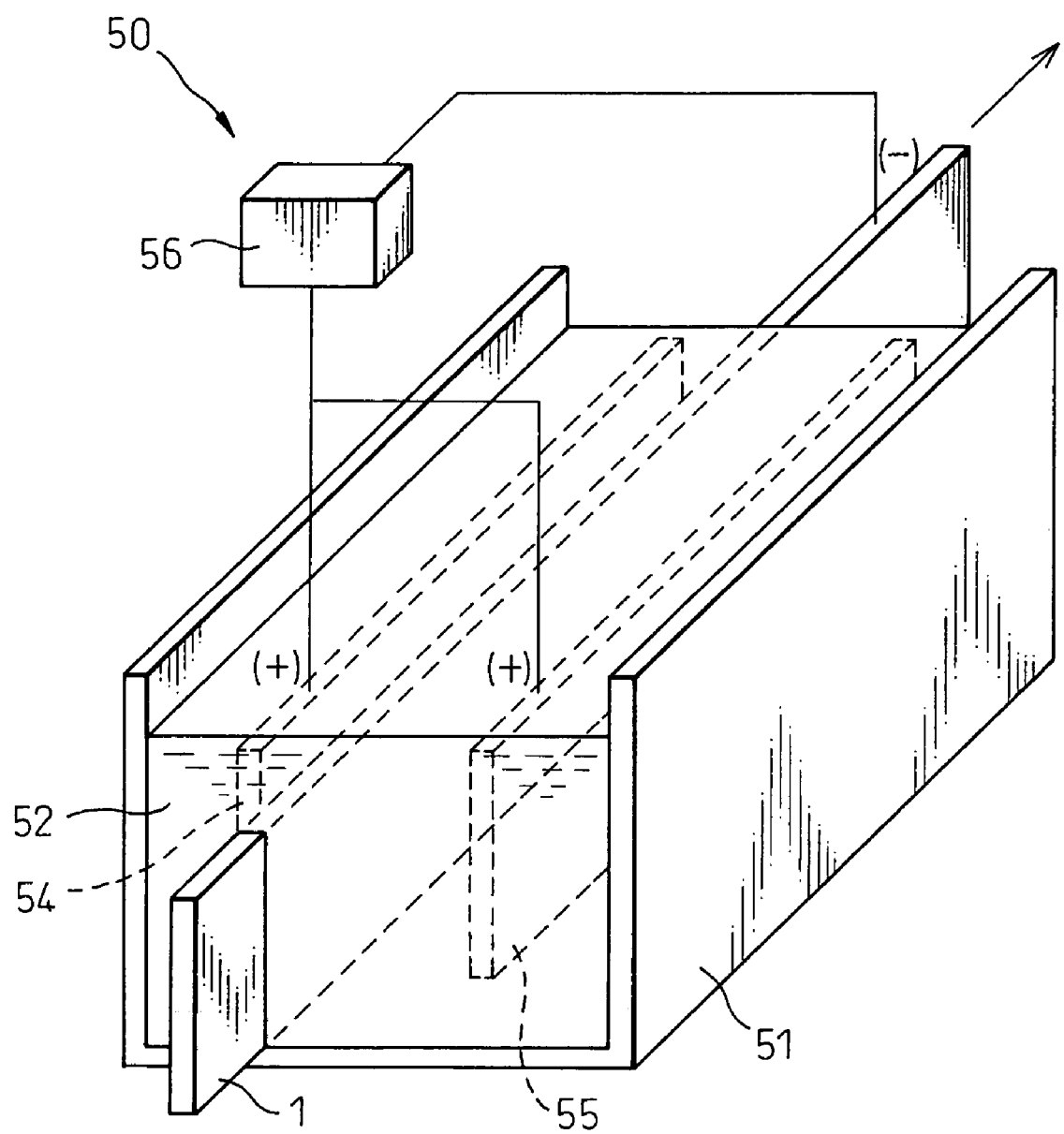
FIG. 14 is a perspective view schematically illustrating a method of forming a rough surface plated layer as an electrically conducting film according to the present invention.
Figure 15:
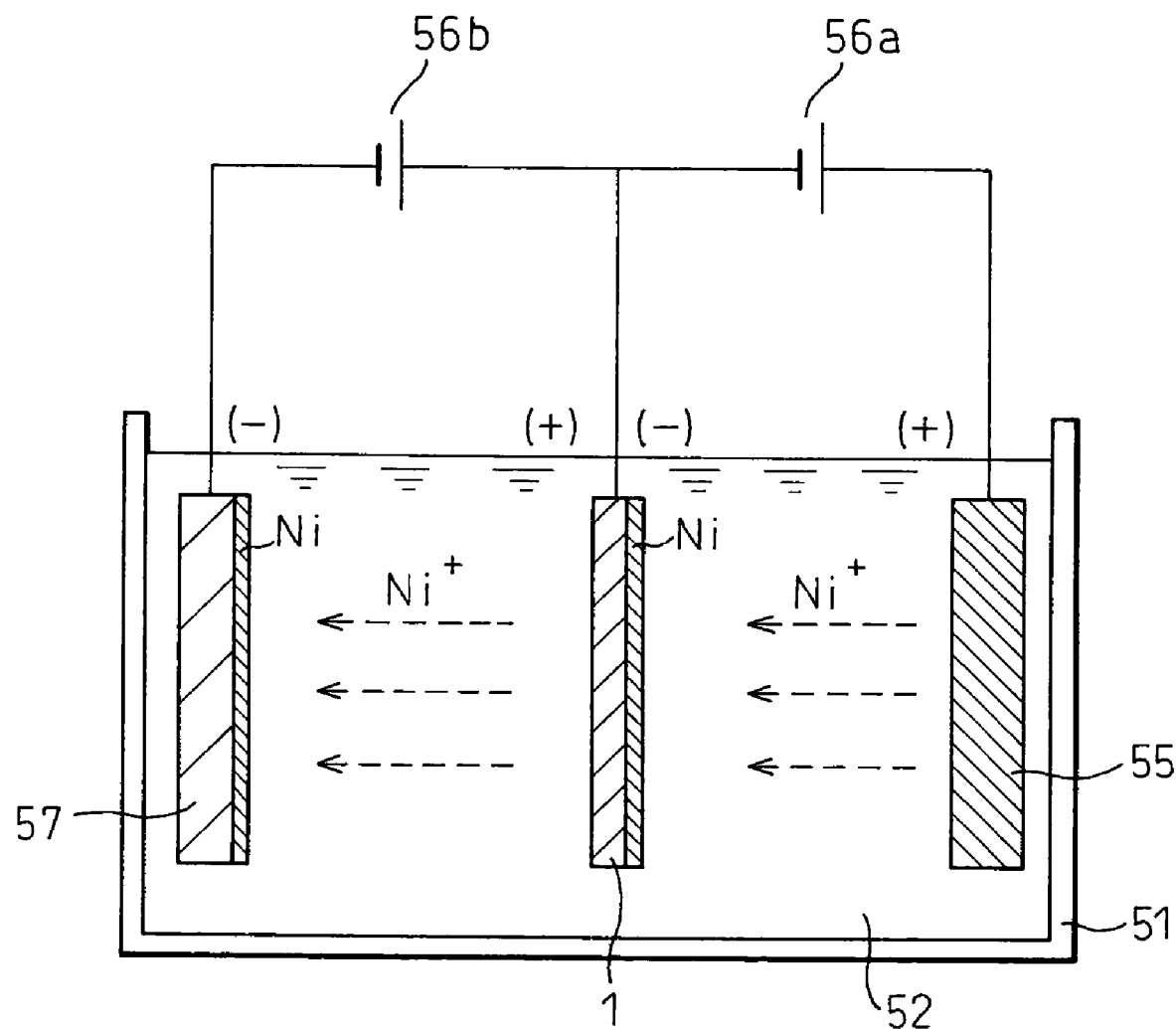
FIG. 15 is a sectional view schematically illustrating a method of forming a rough surface plated layer and a smooth surface plated layer as electrically conducting films on only one surface according to the present invention.

For example, the rough-surface plated layer and the smooth-surface plated layer each consisting of nickel can be advantageously formed by using a plating treatment apparatus schematically illustrated in FIG. 14 or 15.

Referring to FIG. 14, a plating treatment apparatus 50 includes a treatment vessel 51 and a treatment solution (nickel-plating bath) 52. The treatment solution 52 can have an optimum composition for a layer that is to be plated. A conductor substrate (precursor of packaging component) 1 such as a lead frame immersed in the treatment vessel 51 can be conveyed in a direction of an arrow by accessory guide rollers (not shown). The treatment solution 52 is maintained at normal temperatures when it is, for example, a nickel chloride-plating bath, and the residence time of the conductor substrate 1 is about 15 seconds to about 30 minutes. The treatment vessel 51 includes two pieces of platinum electrode plates (+) 54 and 55 connected to a rectifier 56 for electroplating. It is also allowable to use nickel chips instead of the platinum electrode plates. The conductor substrate 1, too, is served with power from the rectifier 56.

The plating treatment apparatus 50 of FIG. 14 is useful for separately forming the rough-surface plated layer and the smooth-surface plated layer. When it is desired to form one sheet of conductor substrate having both the rough-surface plated layer and the smooth-surface plated layer or to form one sheet of conductor substrate having either the rough-surface plated layer or the smooth-surface plated layer as illustrated with reference to, for example, FIGS. 10 and 11, the plating treatment apparatus 50 of FIG. 14 can be used after modification thereof. Usually, there can be advantageously used a method of shielding the non-plating surface with a mechanical mask or a resist film, or an electrolytic shielding method. The plating can be selectively precipitated on only the exposed surface of the conductor substrate by conducting the electrolytic plating in a state where the non-plating surface is shielded.

FIG. 15 illustrates a modification of the plating treatment apparatus 50 of FIG. 14 for effecting the electrolytic shielding method. In this apparatus, two rectifiers 56a and 56b are provided for one treatment vessel 51 to form two electric circuits in the treatment vessel 51. One electric circuit connected to the rectifier 56a includes a platinum electrode plate (which may be a nickel chip) 55, and another electric circuit connected to the rectifier 56b includes a dummy electrode plate 57 instead of the platinum electrode plate 54 in FIG. 14. The dummy electrode plate 57 is arranged to prevent nickel being precipitated on the shielding surface of the conductor substrate 1. As shown, nickel ions ($Ni^+$) that have passed through the back surface of the conductor substrate 1 can be selectively precipitated on the surface of the dummy electrode plate 57. This method makes it easy to form the rough-surface plated layer on only one surface of the conductor substrate 1.

EXAMPLES

Next, the invention will be further described by way of examples thereof. In the following examples, the invention deals with copper lead frames plated with nickel under different conditions. It should, however, be noted that the invention should not be limited to these specific examples only.

Example 1

Formation of a Rough-Surface Ni-Plated Layer:

A copper alloy (trade name: CDA194) containing a trace amount of iron (Fe) was used as a starting material, and the surface on one side thereof was electroplated with nickel to form rough-surface Ni-plated layers at different thicknesses, thereby preparing the following four samples.

| Sample A: | layer thickness of 0.5 μm |
|---|---|
| Sample B: | layer thickness of 1.0 μm |
| Sample C: | layer thickness of 3.0 μm |
| Sample D: | layer thickness of 5.0 μm |

The composition of the electroplating bath and the plating conditions used in this example were as follows: Nickel chloride plating bath:

| Nickel chloride | 75 g/L |
|---|---|
| Sodium thiocyanate | 15 g/L |
| Ammonium chloride | 30 g/L |
| pH: | about 4.5 to 5.5 |
| Bath temperature: | normal temperature (about 25° C.) |
| Cathode current density: | about 1 to 3 A/cm$^2$ |

The samples A to D having lusterless surface each was:
(A) Observed for their surface states by using a scanning electron microscope (SEM, ×10,000),
(B) Observed for their cross sections by using a scanning electron microscope (SEM, ×5,000), and
(C) Analyzed for their surface states by using an atomic force microscope (AFM), along with calculation of their average surface roughness (Ra). The AFM was conducted in a measuring range of 10 μm$^2$. The measurement results are shown in FIGS. 16 to 19, and are summarized in Table 1 below.

Figure 16:
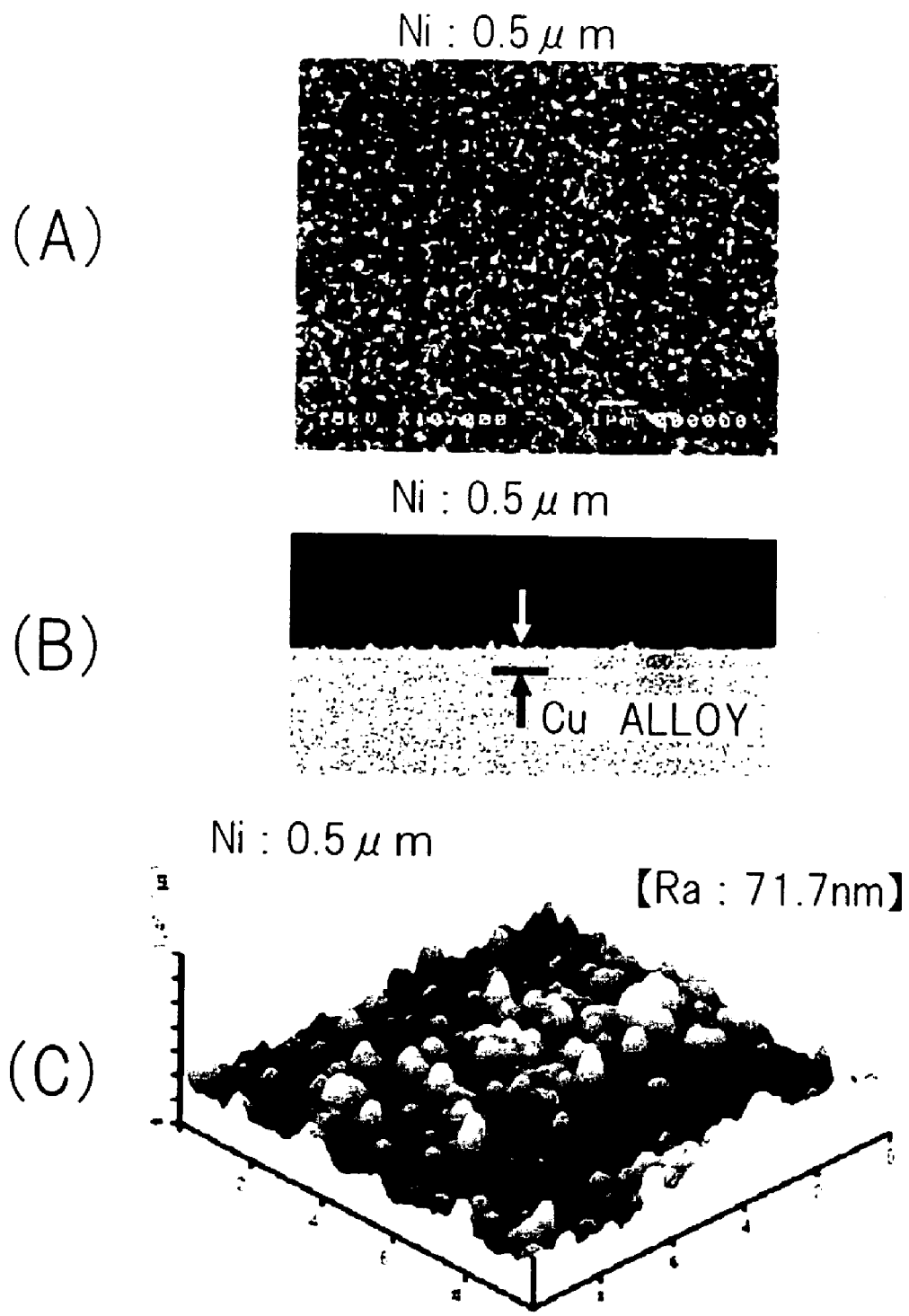
FIG. 16 shows a set of a scanning electron microphotograph (A) (SEM, ×10,000) of the surface state of a rough surface Ni-plated layer (film thickness of 0.5 µm), a scanning electron microphotograph (B) (SEM, ×5,000) of the state in cross section thereof, and a surface analysis diagram (C) using an atomic force microscope (AFM, 10 µm$^2$)
Figure 17:
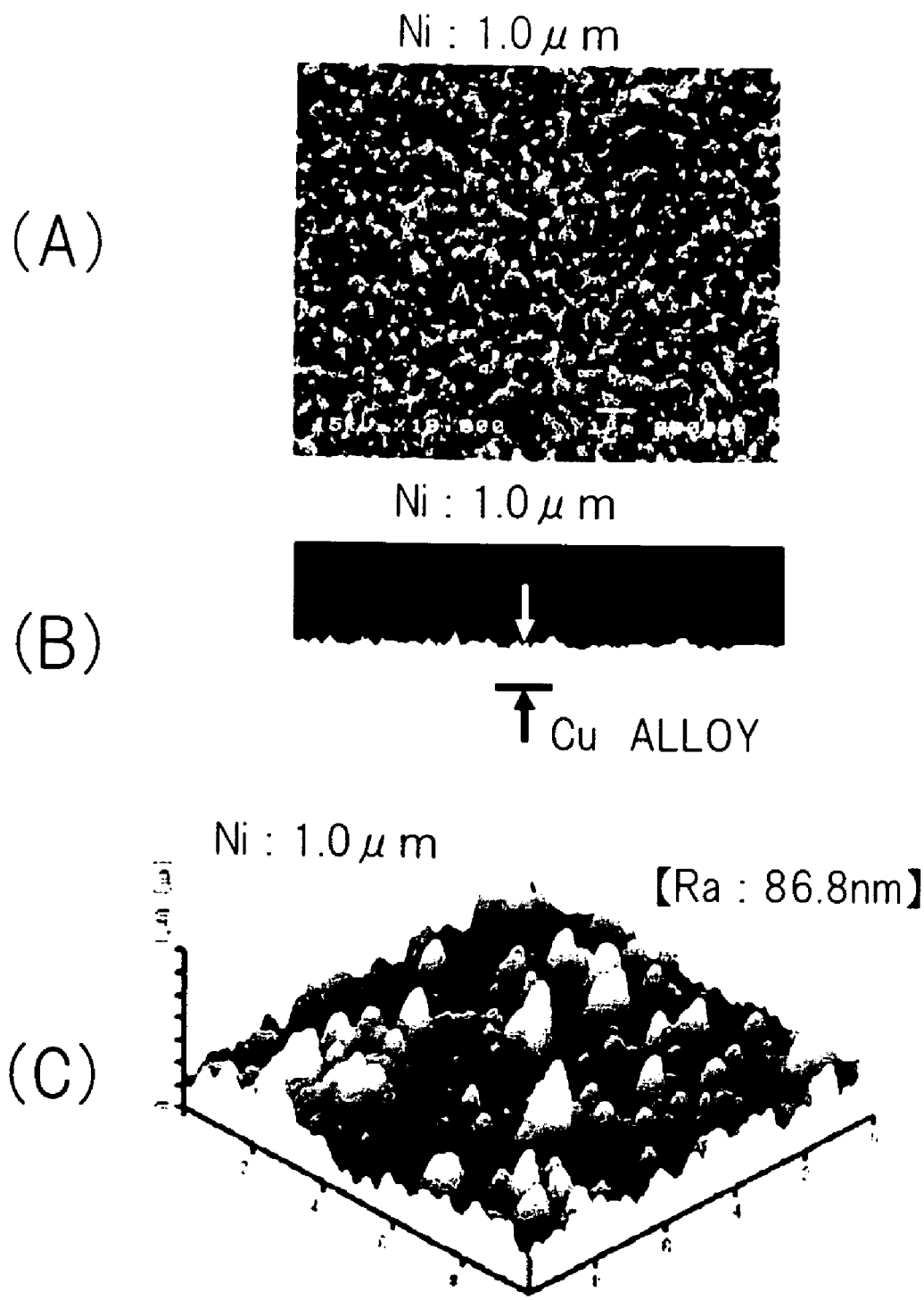
FIG. 17 shows a set of a scanning electron microphotograph (A) (SEM, ×10,000) of the surface state of a rough surface Ni-plated layer (film thickness of 1.0 µm), a scanning electron microphotograph (B) (SEM, ×5,000) of the state in cross section thereof, and a surface analysis diagram (C) using an atomic force microscope (AFM, 10 m$^2$)
Figure 18:
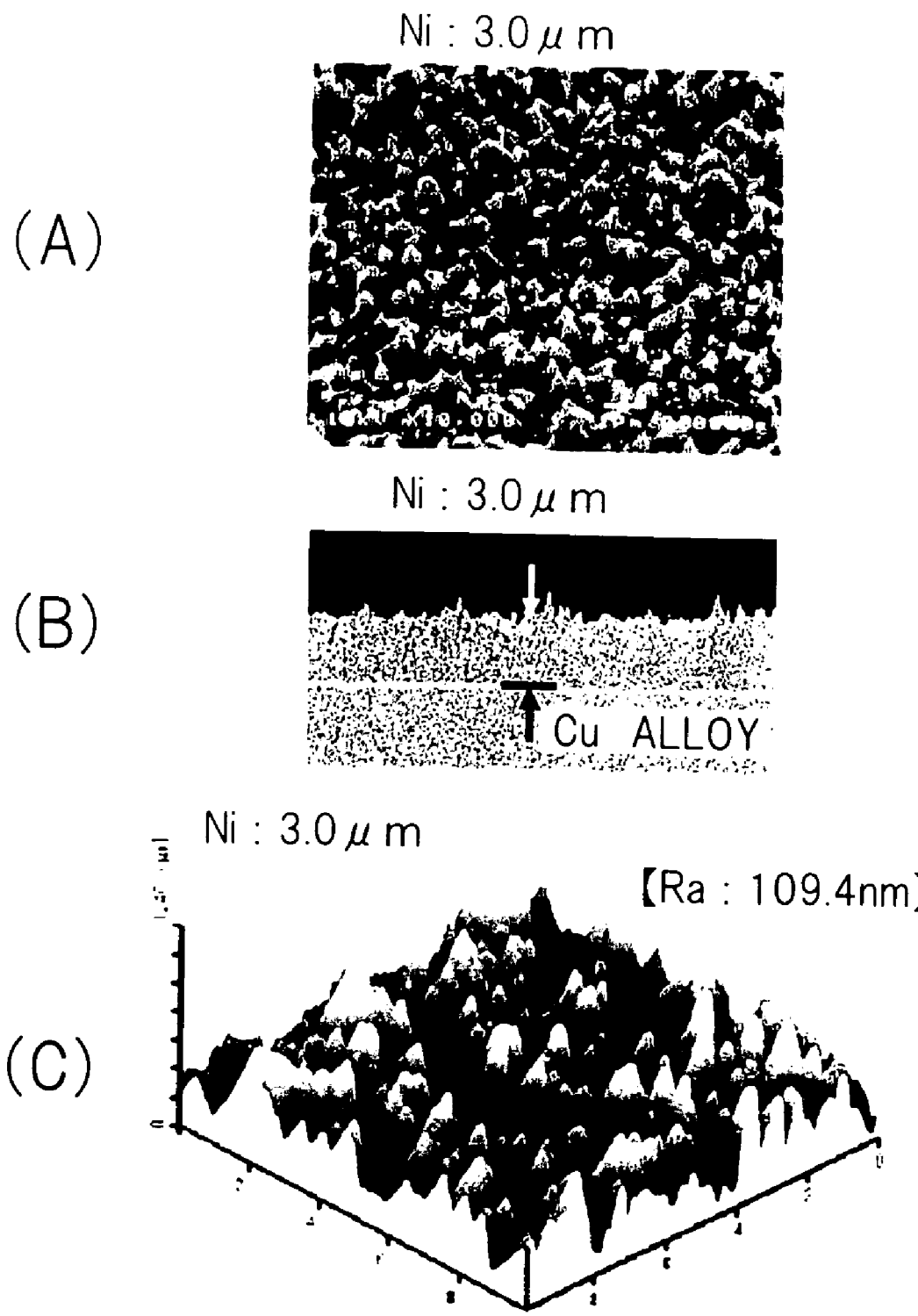
FIG. 18 shows a set of a scanning electron microphotograph (A) (SEM, ×10,000) of the surface state of a rough surface Ni-plated layer (film thickness of 3.0 µm), a scanning electron microphotograph (B) (SEM, ×5,000) of the state in cross section thereof, and a surface analysis diagram (C) using an atomic force microscope (AFM, 10 µm$^2$)
Figure 19:
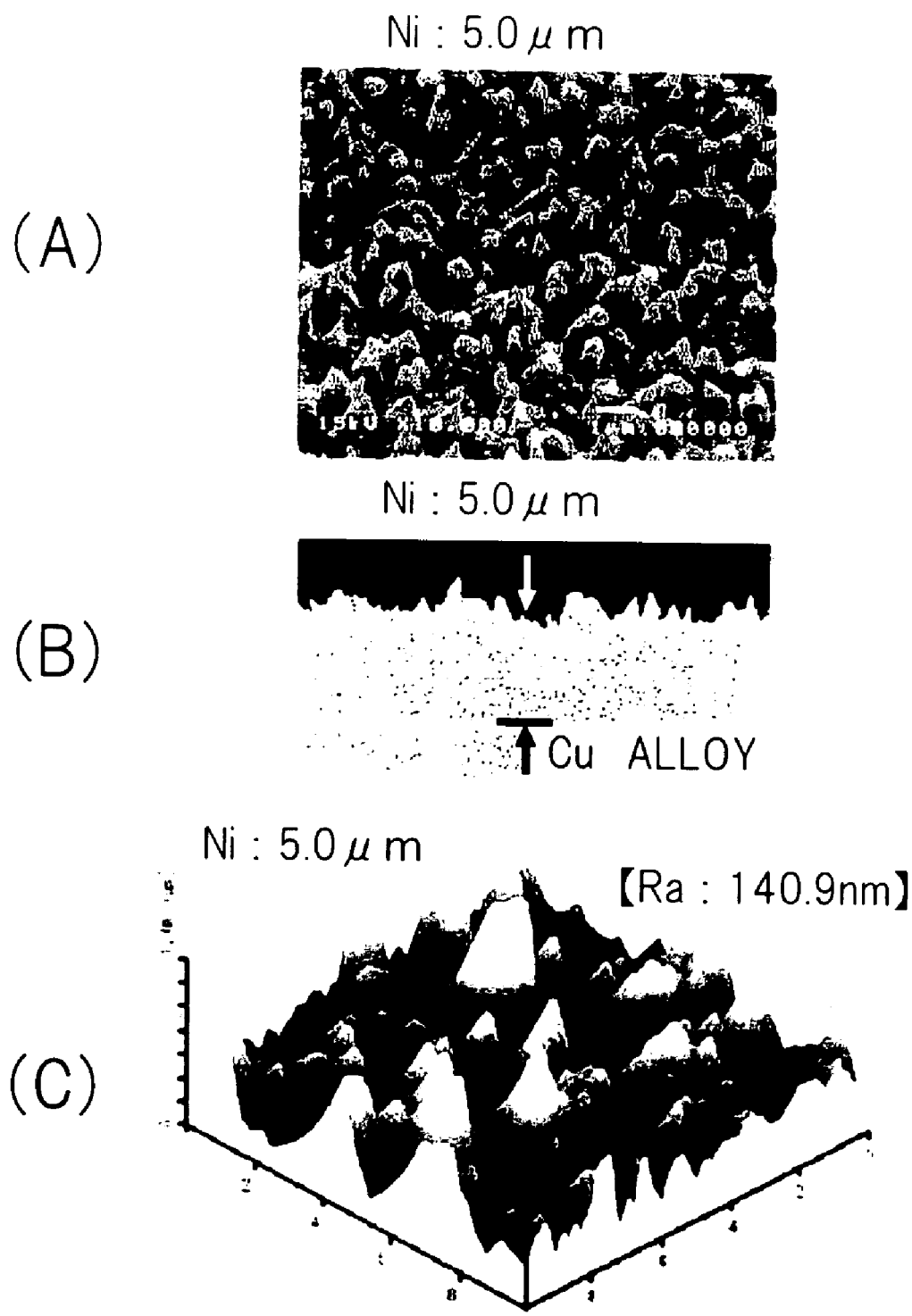
FIG. 19 shows a set of a scanning electron microphotograph (A) (SEM, ×10,000) of the surface state of a rough surface Ni-plated layer (film thickness of 5.0 μm), a scanning electron microphotograph (B) (SEM, ×5,000) of the state in cross section thereof, and a surface analysis diagram (C) using an atomic force microscope (AFM, 10 μm$^2$)

FIG. 16—sample A (Ni layer thickness: 0.5 μm)
FIG. 17—sample B (Ni layer thickness: 1.0 μm)
FIG. 18—sample C (Ni layer thickness: 3.0 μm)
FIG. 19—sample D (Ni layer thickness: 5.0 μm)

As will be understood from these measurement results, an increase in the thickness of the rough-surface Ni-plated layer is accompanied by remarkable formation of needle-like projections and increase in the surface roughness, and also by an increase in the surface area.

Example 2

Formation of a Smooth-Surface Ni-Plated Layer:

A copper alloy (trade name: CDA194) containing a trace amount of iron (Fe) was used as a starting material, and the surface on one side thereof was electroplated with nickel to form smooth-surface Ni-plated layers at different thicknesses, thereby preparing the following four samples.

Sample I: layer thickness of 0.5 μm
Sample II: layer thickness of 1.0 μm
Sample III: layer thickness of 3.0 μm
Sample IV: layer thickness of 5.0 μm The composition of the electroplating bath and the plating conditions used in this example were as follows: Nickel sulfamate plating bath:

| Nickel sulfamate | 320 g/L |
|---|---|
| Boric acid | 30 g/L |
| Nickel bromide | 10 g/L |
| pH: | about 3.0 to 4.0 |

-continued

| | |
|---|---|
| Bath temperature: | about 30 to 50° C. |
| Cathode current density: | about 3 to 30 A/cm$^2$ |

The samples I to IV having matte surface each was:
(A) Observed for their surface states by using a scanning electron microscope (SEM, ×10,000),
(B) Observed for their cross sections by using a scanning electron microscope (SEM, ×5,000), and
(C) Analyzed for their surface states by using an atomic force microscope (AFM),
along with calculation of their average surface roughness (Ra). The AFM was conducted in a measuring range of 10 μm$^2$. The measurement results are shown in FIGS. 20 to 23, and summarized in Table 1 below.

Figure 21:
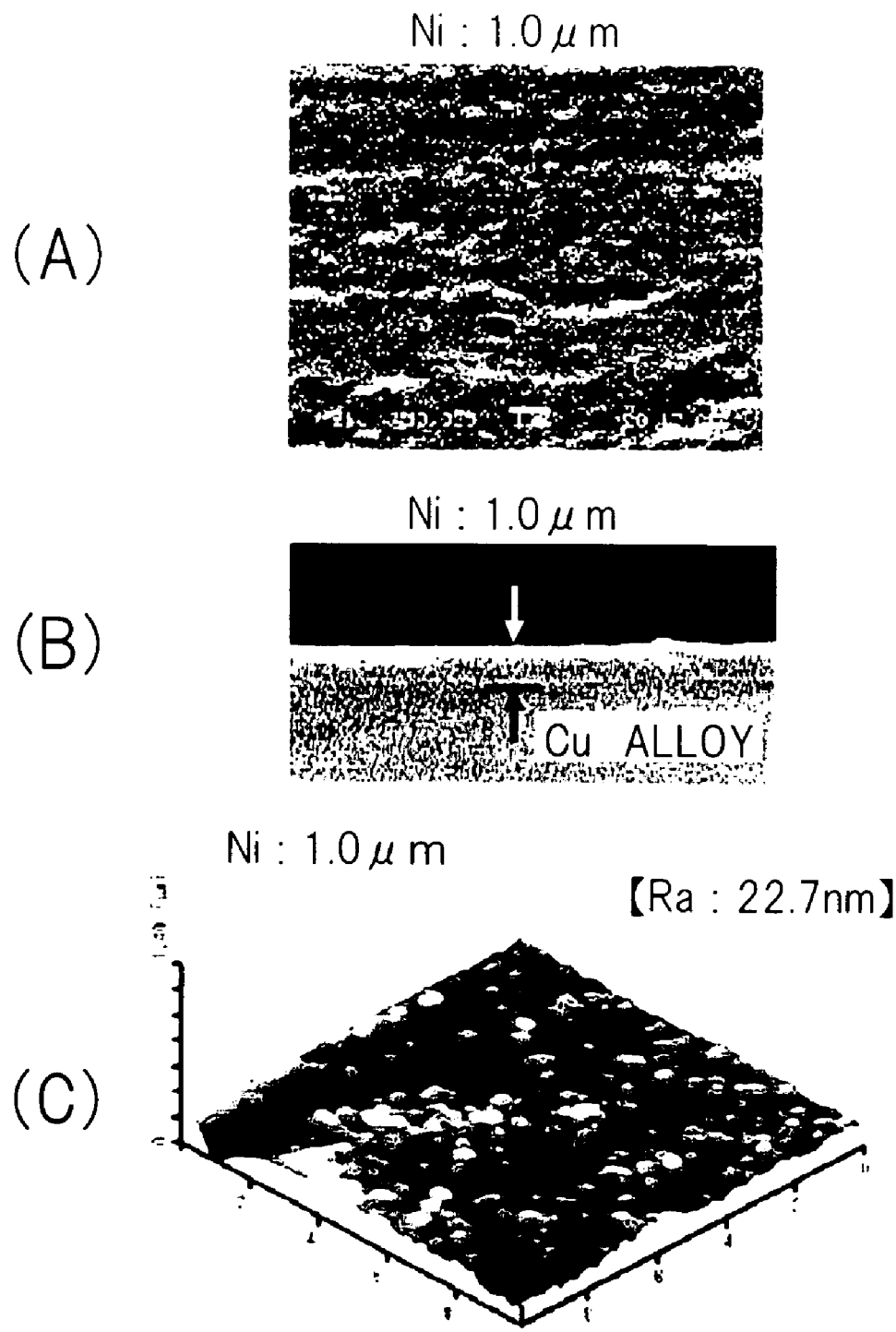
FIG. 21 shows a set of a scanning electron microphotograph (A) (SEM, ×10,000) of the surface state of a smooth surface Ni-plated layer (film thickness of 1.0 μm), a scanning electron microphotograph (B) (SEM, ×5,000) of the state in cross section thereof, and a surface analysis diagram (C) using an atomic force microscope (AFM, 10 μm$^2$)
Figure 22:
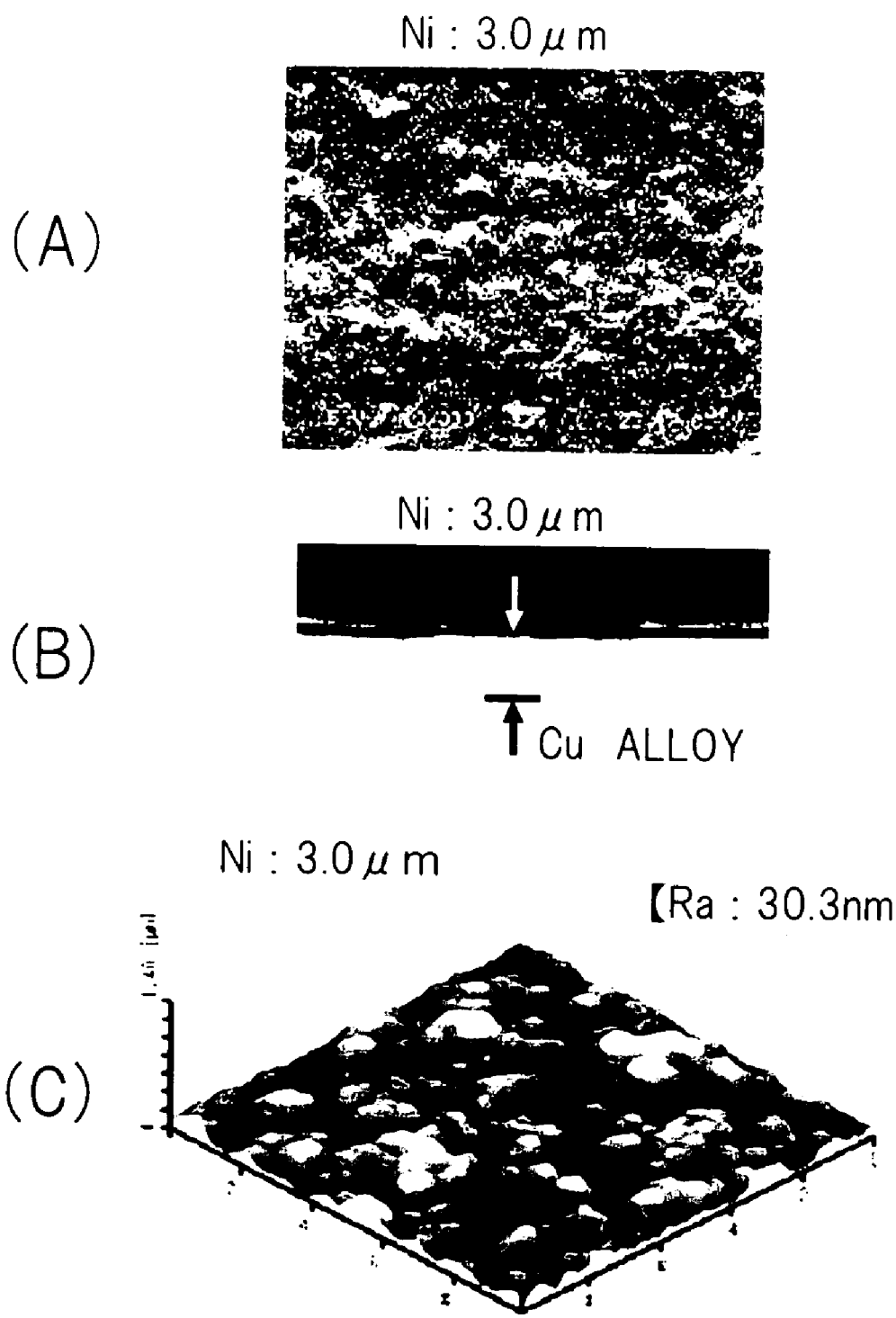
FIG. 22 shows a set of a scanning electron microphotograph (A) (SEM, ×10,000) of the surface state of a smooth surface Ni-plated layer (film thickness of 3.0 μm), a scanning electron microphotograph (B) (SEM, ×5,000) of the state in cross section thereof, and a surface analysis diagram (C) using an atomic force microscope (AFM, 10 μm$^2$)
Figure 23:
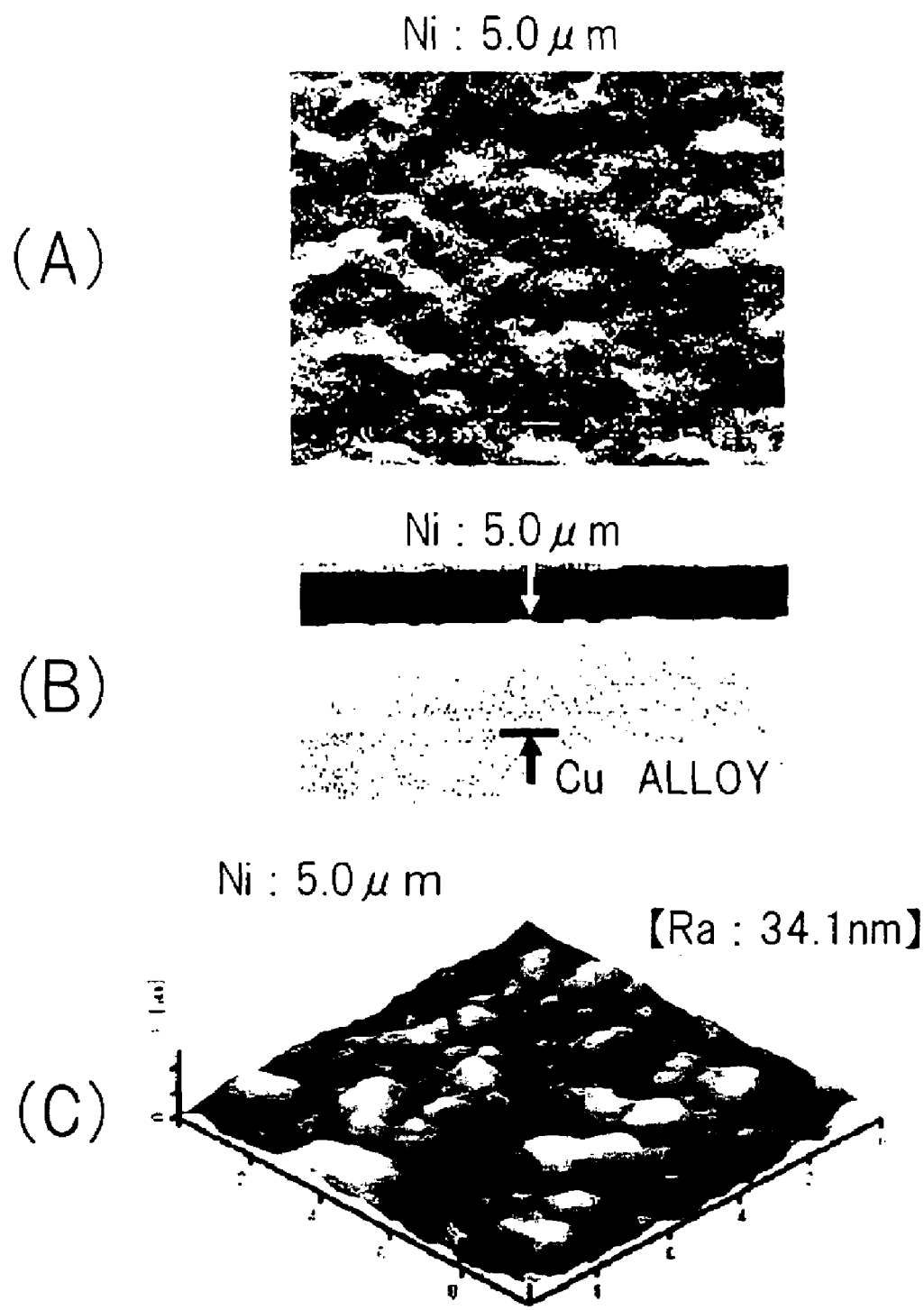
FIG. 23 shows a set of a scanning electron microphotograph (A) (SEM, ×10,000) of the surface state of a smooth surface Ni-plated layer (film thickness of 5.0 μm), a scanning electron microphotograph (B) (SEM, ×5,000) of the state in cross section thereof, and a surface analysis diagram (C) using an atomic force microscope (AFM, 10 μm$^2$)

FIG. 20—sample I (Ni layer thickness: 0.5 μm)
FIG. 21—sample II (Ni layer thickness: 1.0 μm)
FIG. 22—sample III (Ni layer thickness: 3.0 μm)
FIG. 23—sample IV (Ni layer thickness: 5.0 μm)

As will be understood from these measurement results, despite of an increase in the thickness of the rough-surface Ni-plated layer, no remarkable change was recognized in the surface roughness, and the surface area did not increase, either.

TABLE 1

| Ni-plated layer | Thickness of Ni plating | Average surface roughness (Ra) | Maximum difference in height (P − V) |
|---|---|---|---|
| Smooth-surface plated layer (matte nickel layer) | 0.5 μm | 17.6 nm | 195 nm |
| | 1.0 μm | 22.7 nm | 325 nm |
| | 3.0 μm | 30.3 nm | 340 nm |
| | 5.0 μm | 34.1 nm | 545 nm |
| Rough-surface plated layer (lusterless nickel layer) | 0.5 μm | 71.7 nm | 771 nm |
| | 1.0 μm | 86.8 nm | 1026 nm |
| | 3.0 μm | 109.4 nm | 1225 nm |
| | 5.0 μm | 140.9 nm | 1497 nm |

As will be understood from the measurement results in Table 1 above, when the rough-surface layers are plated or when both the rough-surface layers and smooth-surface layers are plated in combination on both surfaces of the packaging component according to the present invention, it becomes possible to improve an adhesion between the packaging component and the sealing resin or the adhesive agent, to prevent the occurrence of scars or stains on the surfaces of the packaging component, and to improve an appearance of the packaging component.

Prevention of scars on the package surfaces will be seen in FIGS. 24 and 25.

The reel-like copper lead frame was plated with smooth-surface Ni layer according to the method described above, cut into a sheet size for shipping, and a fixing tape was stuck to secure the leads for suppressing dispersion of the leads. The surface state of the Ni-plated layer of the resulting lead frame was observed through a microscope (×50). As shown in FIG. 24(A), however, there was recognized no scar due to abrasion that was observed in FIG. 3(A). Even the observation on an enlarged scale by using the electron microscope (×2,000) showed no change in the crystalline state of the Ni-plated layer as shown in FIG. 24(B). The same lead frames were observed for their surface states of the Ni-plated layer at different positions by using the microscope (×50). As shown in FIG. 25(A), however, there was recognized no scar caused by the holding, that was observed in FIG. 4(A). Even the observation on an enlarged scale by using the electron microscope (×2,000) showed no change in the crystalline state of the Ni-plated layer as shown in FIG. 25(B).

Example 3

Measurement of the Cup Shear Strength:

In this example, the samples A to D prepared in Example 1 and the samples I to IV prepared in Example 2 were measured for their cup shear strengths according to the procedure specified under SEMI Standard G69-0996 to evaluate the adhesion of the resin to the rough-surface Ni-plated layer and to the smooth-surface Ni-plated layer.

Figure 26A:
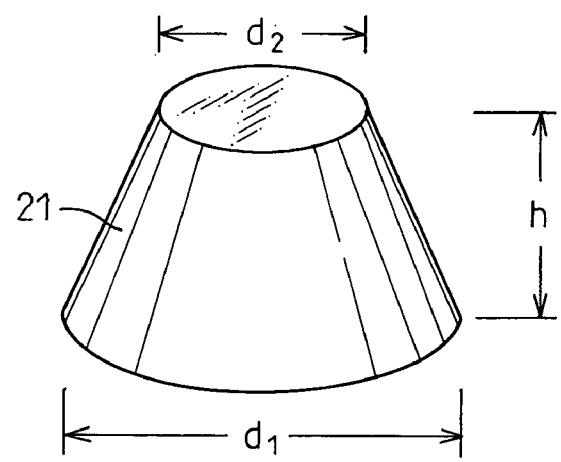
FIG. 26A is a perspective view illustrating a cup used in the measurement of cup shear strength.

First, cups 21 in the shape of a circular truncated cone having a height h of 3 mm, a bottom diameter $d_1$ of 3.568 mm, an upper diameter $d_2$ of 3 mm and a surface area of 10.2 mm$^2$ as illustrated in FIG. 26A were molded by using the following two types of sealing resins:

Sealing resin A—OCN type (produced by "N" Company)
Sealing resin B—BNL type (produced by "H" Company)

Figure 26B:
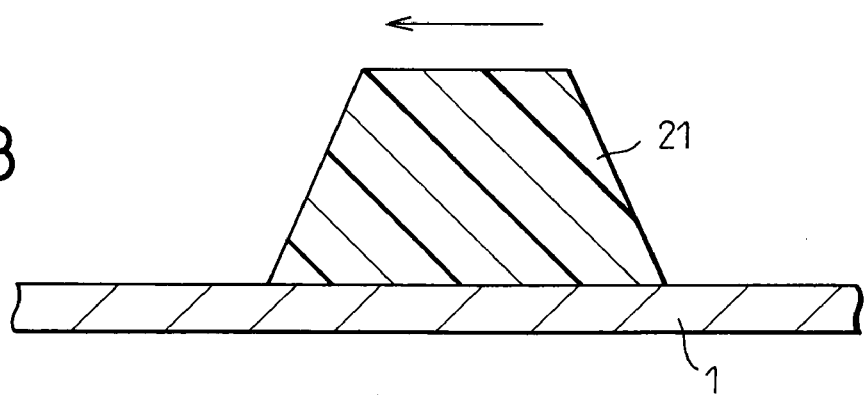
FIG. 26B is a cross-sectional view schematically illustrating a method of measuring the cup shear strength.

The cup 21 was placed on a sample (lead frame) 1 as illustrated in FIG. 26(B) and was heated (post-cured) at 175° C. for 6 hours.

Figure 27:
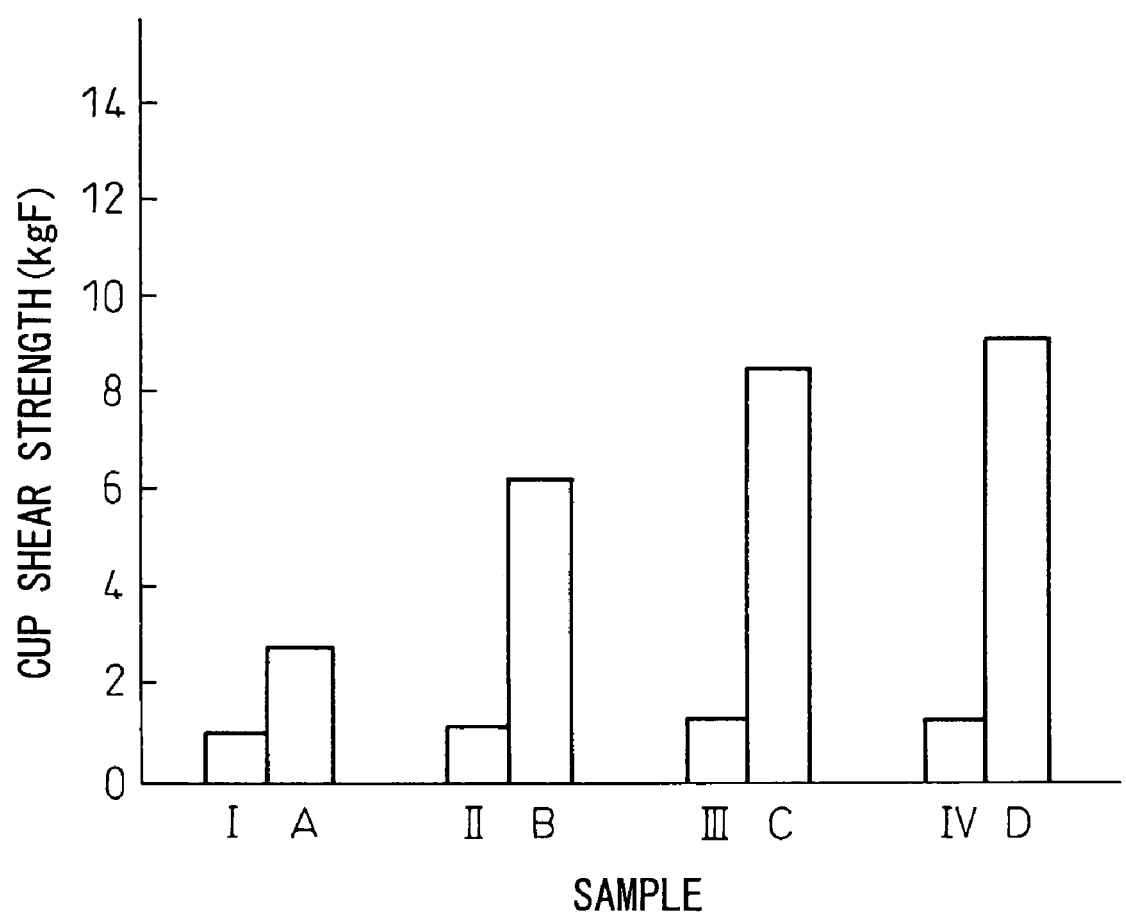
FIG. 27 is a graph plotting the measured results of the cup shear strengths at different Ni-plated layers.
Figure 28:
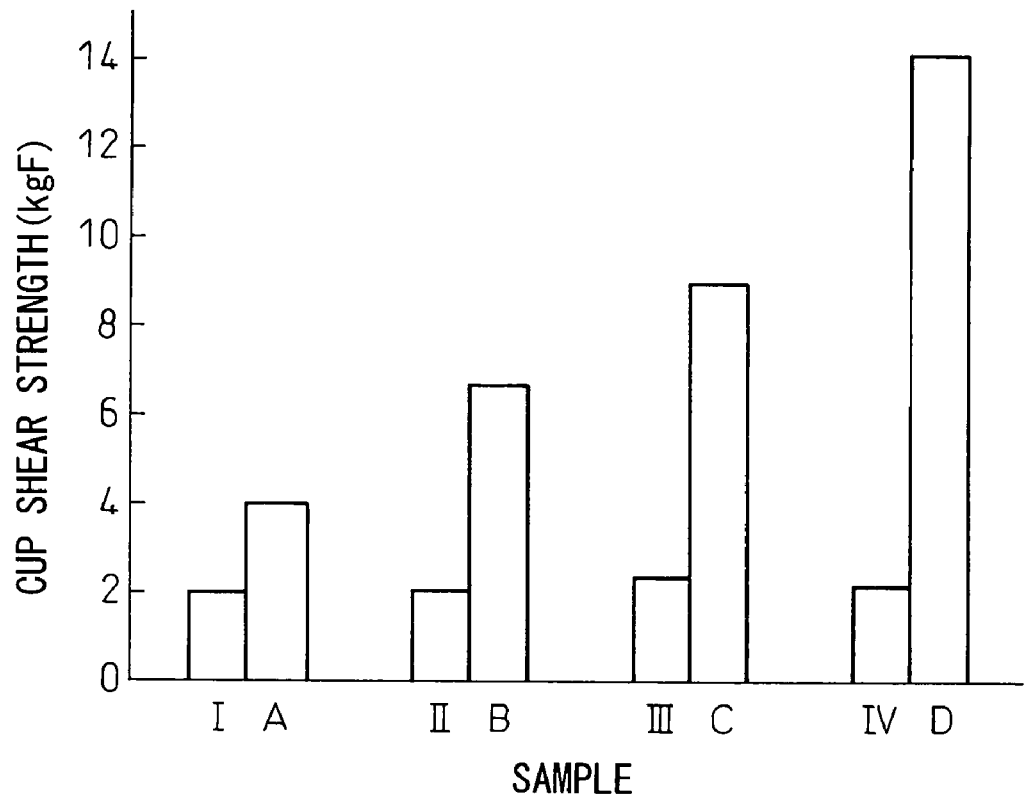
FIG. 28 is a graph plotting the measured results of the cup shear strengths at different Ni-plated layers.

After the cup 21 was cured and formed upon heating on the sample 1, a gauge (not shown) was pushed onto the cup 21 and was moved in the direction of an arrow shown in FIG. 26(B) to measure the shear strength. The shearing test was conducted at a gauge height of 50 μm, at a speed of 200 μm/sec and at a shearing temperature of room temperature (about 25° C.). FIG. 27 is a graph plotting the cup shear strengths measured for each of the samples by using the sealing resin A, and FIG. 28 is a graph plotting the cup shear strengths measured for each of the samples by using the sealing resin B.

Example 4

In this example, the adhesion of the resin to the rough-surface Ni-plated layer and to the smooth-surface Ni-plated layer each having a three-layer structure was evaluated in terms of a cup shear strength.

Figure 29A:
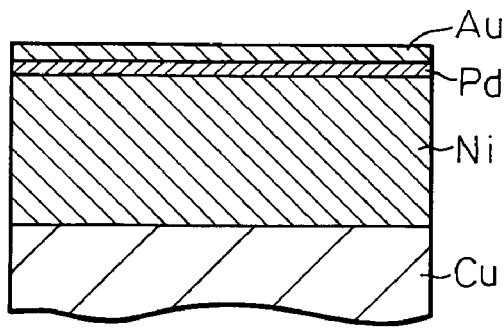
FIG. 29A is a sectional view schematically illustrating the constitution of the smooth surface Ni-plated layer having a three-layer structure of samples used for measuring the cup shear strength.

Preparation of samples I-1 to I-7:

Smooth-surface nickel layers having different thicknesses (0.3, 0.5, 0.7, 1.0, 1.2, 1.5 and 2.0 μm) were electroplated on the surface on one side of the copper alloy (trade name: DCA194) according to the method described in Example 2 above. Then, as illustrated in FIG. 29(A), a palladium (Pd) layer having a thickness of 0.05 μm and a gold (Au) layer having a thickness of 0.005 μm were successively plated on the smooth-surface Ni-plated layer. The surface of the Au-plated layer remained smooth like that of the Ni-plated layer.

Figure 29B:
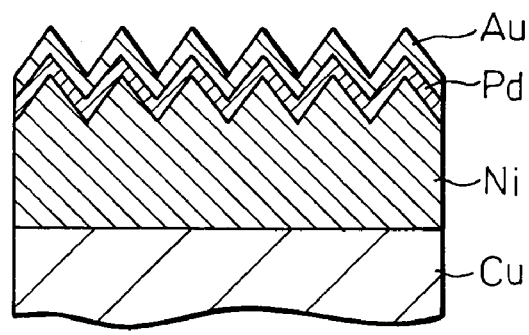
FIG. 29B is a sectional view schematically illustrating the construction of the rough surface Ni-plated layer having a three layer structure of samples used for measuring the cup shear strength.

Preparation of samples A-1 to A-7:

Rough-surface nickel layers having different thicknesses (0.3, 0.5, 0.7, 1.0, 1.2, 1.5 and 2.0 μm) were electroplated on the surface on one side of the copper alloy (trade name: DCA194) according to the method described in Example 1 above. Then, as illustrated in FIG. 29(B), a palladium (Pd) layer having a thickness of 0.05 μm and a gold (Au) layer having a thickness of 0.005 μm were successively plated on the rough-surface Ni-plated layer. The surface of the Au-plated layer was reproducing the rough surface of the underlying Ni-plated layer.

Measurement of the Cup Shear Strengths:

The samples I-1 to I-7 and the samples A-1 to A7 prepared as described above were subjected to measurement of cup shear strengths by the same method as that of Example 3. In this example, cups in the shape of a circular truncated cone were molded by using the sealing resin B of the BNL type.

Figure 30:
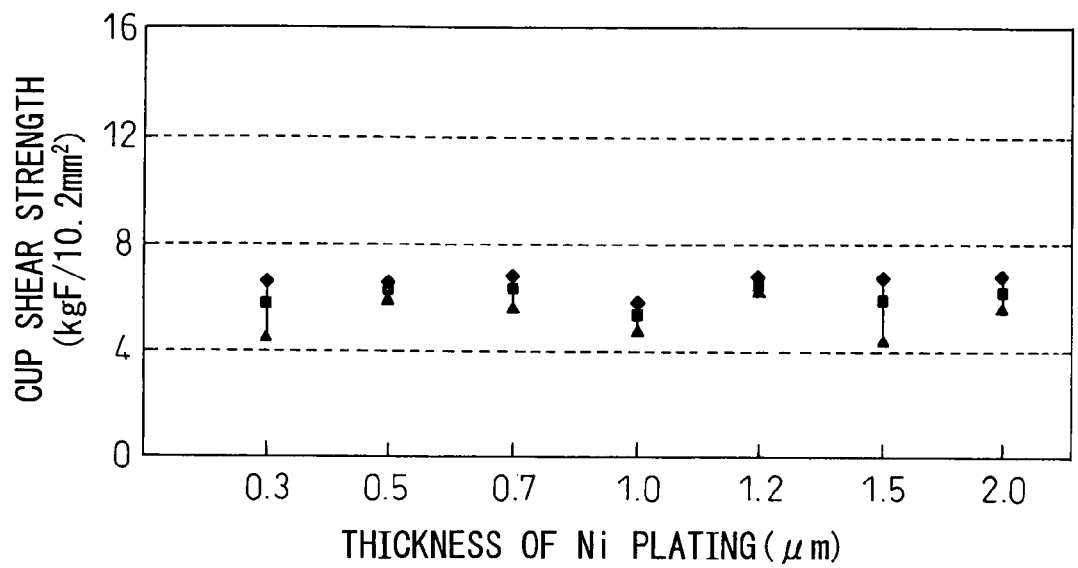
FIG. 30 is a graph plotting the measured results of the initial cup shear strength of a smooth surface Ni-plated layer having the three-layer structure.

First, the initial samples I-1 to I-7 (immediately after post-cured) were measured for their cup shear strengths according to the procedure specified under SEMI Standard G69-0996 to evaluate the adhesion of the resin to the smooth-surface Ni-plated layer. FIG. 30 is a graph plotting the cup shear strengths measured for each of the samples.

Figure 31:
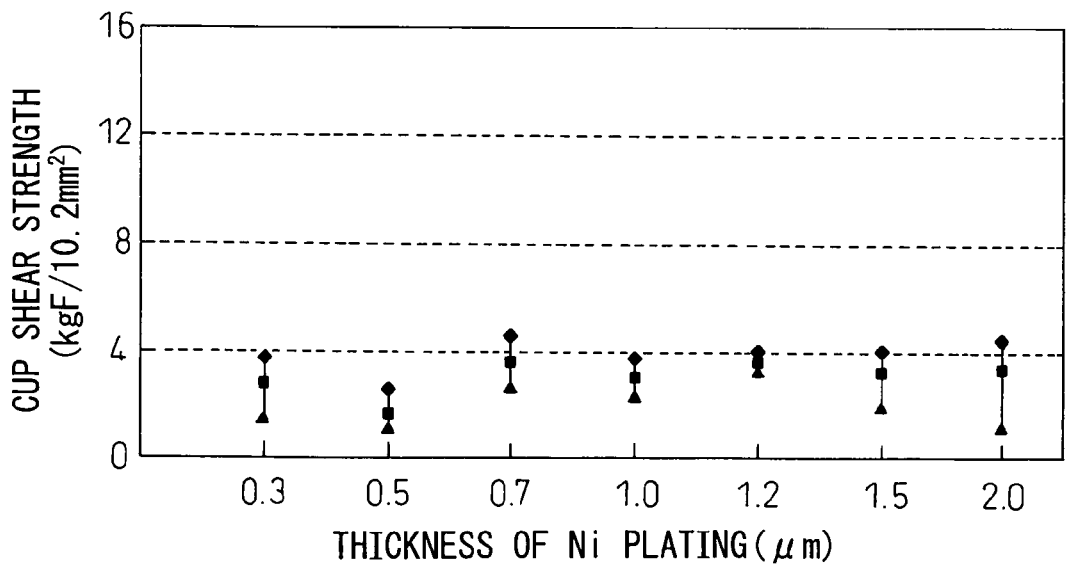
FIG. 31 is a graph plotting the measured results of the cup shear strength after aging of a smooth surface Ni-plated layer having the three-layer structure.

Next, the samples I-1 to I-7 were aged in air on a hot plate heated at 300° C. for 10 seconds to measured for their cup shear strengths according to the procedure specified under SEMI Standard G69-0996 to evaluate the adhesion of the resin to the smooth-surface Ni-plated layer. The aging treatment was conducted simulating a high-temperature treatment in the solder reflowing step included in the practical production of the semiconductor package. FIG. 31 is a graph plotting the cup shear strengths measured for each of the samples.

Figure 32:
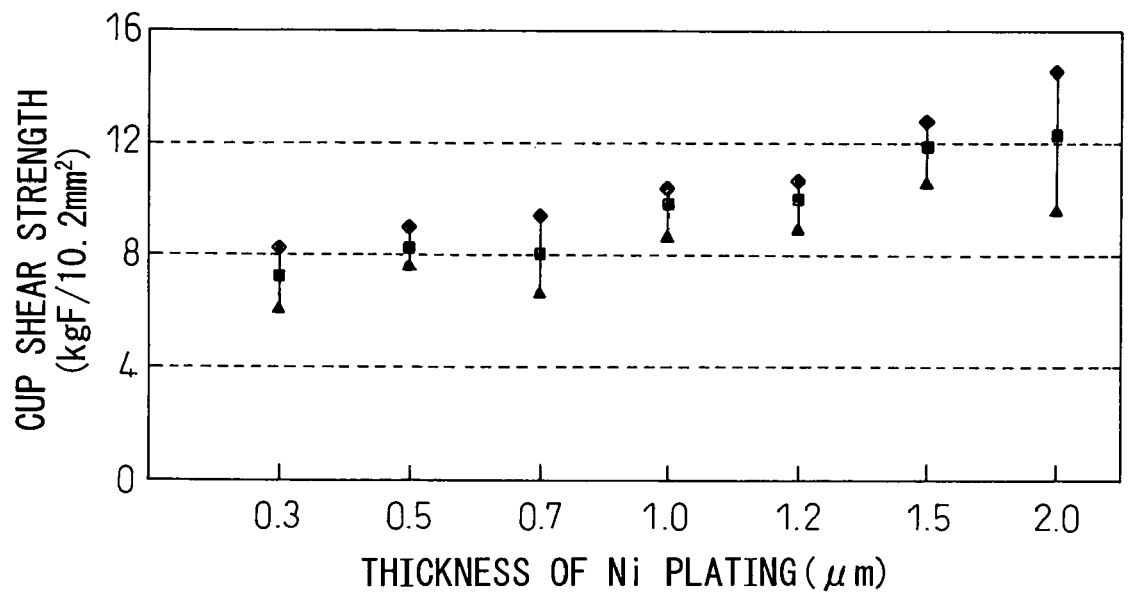
FIG. 32 is a graph plotting the measured results of the initial cup shear strength of a rough surface Ni-plated layer having the three-layer structure.

Then, the initial samples A-1 to A-7 (immediately after being post-cured) were measured for their cup shear strengths according to the procedure specified under SEMI Standard G69-0996 to evaluate the adhesion of the resin to the rough-surface Ni-plated layer. FIG. 32 is a graph plotting the cup shear strengths measured for each of the samples.

Figure 33:
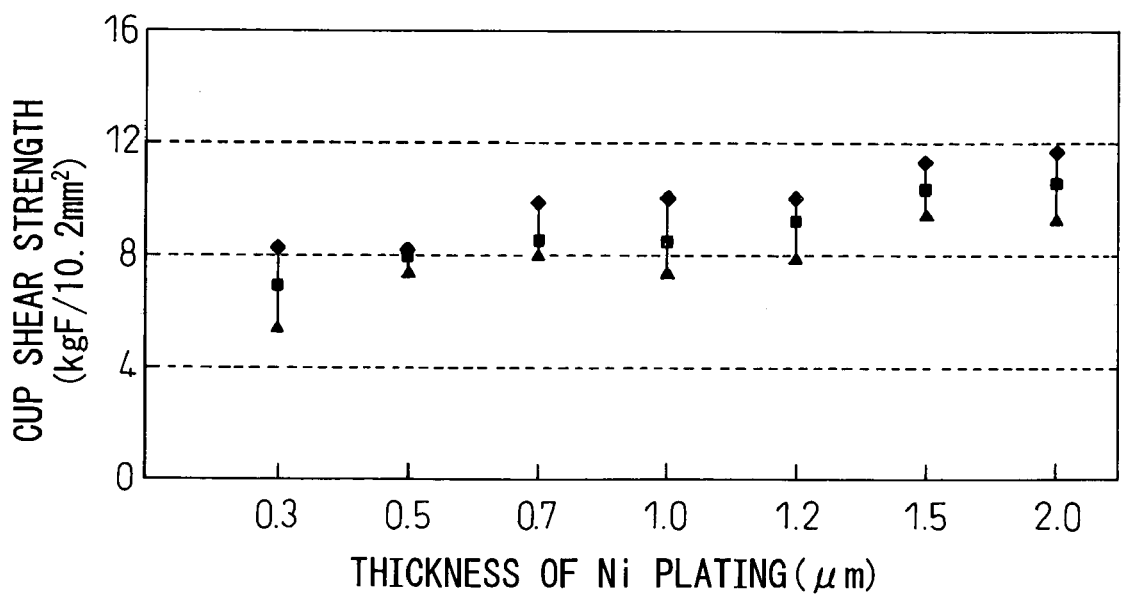
FIG. 33 is a graph plotting the measured results of the cup shear strength after aging of a rough surface Ni-plated layer having the three-layer structure.
Figure 12:
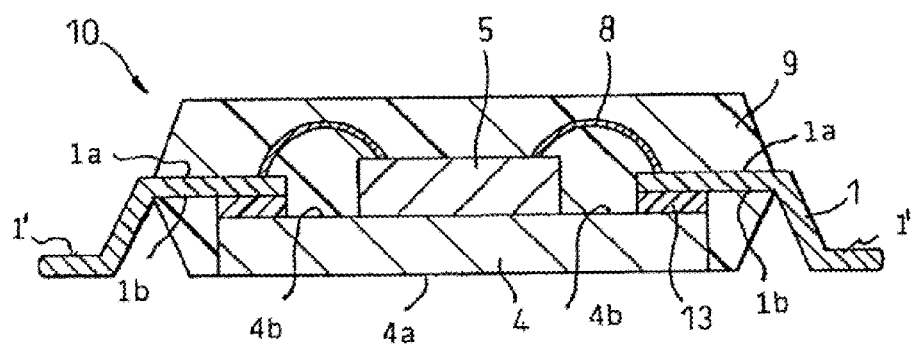
Figure 13:
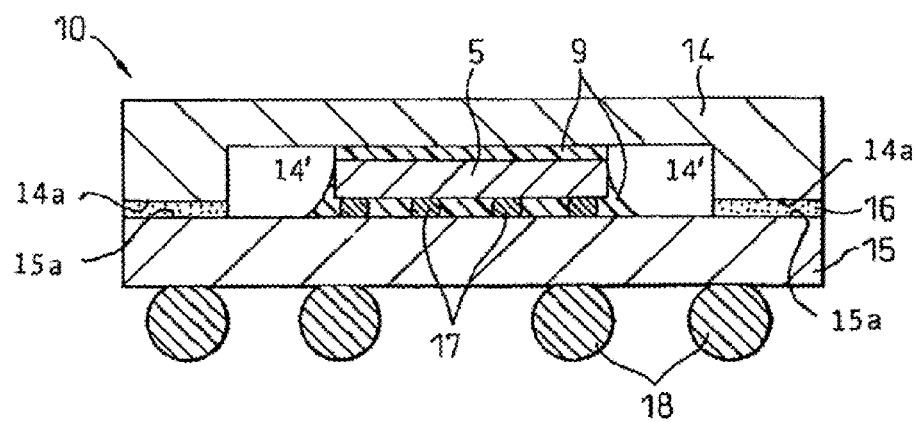

Thereafter, the samples A-1 to A-7 were aged in air on a hot plate heated at 300° C. for 10 seconds to measured for their cup shear strengths according to the procedure specified under SEMI Standard G69-0996 to evaluate the adhesion of the resin to the rough-surface Ni-plated layer. FIG. 33 is a graph plotting the cup shear strengths measured for each of the samples.

As will be understood from the graphs of FIGS. 30 and 31 illustrating the measured results of the smooth-surface plated layer and from the graphs of FIGS. 32 and 33 illustrating the measured results of the rough-surface plated layer, the adhesion of the resin to the plated layer is very larger in the case of the rough-surface plated layer than that of the resin to the smooth-surface plated layer, and the adhesion does not greatly decrease due to the aging.

As described above in detail, according to the present invention, there is provided a packaging component such as a lead frame or a heat-radiating plate which, when used for the production of semiconductor packages or the like, exhibits excellent adhesion of the sealing resin or the adhesive to the packaging component without permitting the adhesion to be deteriorated.

Further, the packaging component of the present invention exhibits excellent adhesion, does not permit the adhesion to be deteriorated, does not cause defects such as scars or stains while the semiconductor packages or the like is being produced or is handled, and contributes greatly to improving the productivity, and appearance and quality.

Furthermore, use of the packaging component of the invention makes it possible to produce various types of products inclusive of the semiconductor packages as well as the packages having excellent appearance easily with a good yield.

In addition, in particular, according to the present invention, as an electrically conducting layer can be applied in combination with a rough-surface plated layer and a smooth-surface plated layer to the packaging component, it becomes possible to satisfy the diversifying requirements for the semiconductor packages, such as improving the adhesion and preventing scars and stains during the handling.

The invention claimed is:

1. A packaging component used for constituting a package mounting a semiconductor element or any other packages, having, on at least a portion of a surface thereof, a covered surface which is sealed with an insulating resin or on which an adhesive layer is applied, said packaging component comprising a conductor substrate and an electrically conducting layer partly or entirely covering the surface thereof, and said electrically conducting layer comprising a rough-surface plated layer having a roughened surface profile on said covered surface, and wherein the surface of said packaging component comprises an uncovered surface exposed to an outer side of the packaging component in the absence of said insulating resin and/or said adhesive layer, in addition to said covered surface, and, in said uncovered surface, said electrically conducting layer comprises a smooth-surface plated layer having a smooth surface profile.

2. A packaging component according to claim 1, wherein substantially a whole surface of said packaging component is occupied by said covered surface and comprises a rough-surface plated layer having a roughened surface profile.

3. A packaging component according to claim 1, wherein said rough-surface plated layer in said covered surface and said smooth-surface plated layer in said uncovered surface are formed from the same or different plating metals.

4. A packaging component according to claim 1, wherein said rough-surface plated layer in said covered surface and said smooth-surface plated layer in said uncovered surface have the same or different layer thicknesses.

5. A packaging component according to claim 3, wherein said plating metal is nickel, copper, palladium, gold, silver, tin, chromium or an alloy thereof.

6. A packaging component according to claim 1, wherein the roughened surface profile of said electrically conducting layer has a needle-like crystalline structure of the plating metal.

7. A packaging component according to claim 6, wherein said plating metal is nickel, copper, palladium or an alloy thereof.

8. A packaging component according to claim 1, wherein said electrically conducting layer in said covered surface has a multi-layer structure of two or more layers.

9. A packaging component according to claim 8, wherein the multi-layer structure of said electrically conducting layer is selected from the group consisting of:
   a smooth-surface plated layer and a rough-surface plated layer formed in this order on the conductor substrate;
   a rough-surface plated layer and a surface-plated layer formed in this order on the conductor substrate; and
   a smooth-surface plated layer, a rough-surface plated layer and a surface plated layer formed in this order on the conductor substrate.

10. A packaging component according to claim 9, wherein said surface plated layer is a layer reproducing a roughened surface profile of the underlying rough-surface plated layer.

11. A packaging component according to claim 10, wherein said surface plated layer comprises a metal selected from the group consisting of gold, silver, copper, palladium, nickel, tin, chromium and an alloy thereof.

12. A packaging component according to claim 9, wherein said surface plated layer is a layer having a surface roughened by oxidizing the underlying plated layer.

13. A packaging component according to claim 1, wherein said conductor substrate comprises an alloy or compound of copper or non-copper metal.

14. A packaging component according to claim 13, wherein said non-copper metal is aluminum or iron-nickel.

15. A packaging component according to claim 1, which is a lead frame, a heat-radiating plate or a combination thereof.

16. A semiconductor package comprising at least one semiconductor element in combination with a packaging component described in claim 1.

17. A semiconductor package according to claim 16, wherein said packaging component is a lead frame, said semiconductor element is mounted at a predetermined position on said lead frame and is sealed with an insulating resin.

18. A semiconductor package according to claim 17, wherein substantially the whole surface of said lead frame is sealed with the insulating resin.

19. A semiconductor package according to claim 18, further comprising an externally exposed heat-radiating plate of which the surface is partly exposed to the outer side.

20. A semiconductor package according to claim 17, wherein said lead frame is partly exposed to the outer side.

21. A semiconductor package according to claim 16, wherein said packaging component is a heat-radiating plate of which the surface is partly exposed to the outer side.

22. A semiconductor package according to claim 21, wherein said semiconductor element is mounted on the wiring board, and said heat-radiating plate is bonded to said wiring board via an adhesive layer.

23. A package component according to claim 1, wherein said electrically conducting layer in said covered surface consists of a rough-surface plated layer, and said electrically conducting layer in said uncovered surface consists of a smooth-surface plated year.

24. A package component according to claim 1, wherein said electrically conductive layer in said covered surface consists of a smooth-surface plated layer and a rough-surface plated layer formed in this order on the conductor substrate, and said electrically conducting layer in said uncovered surface consists of a smooth-surface plated layer.

25. A packaging component used for constituting a package mounting a semiconductor element or any other packages, having, on at least a portion of the surface thereof, a covered surface which is sealed with an insulating resin or on which an adhesive layer is applied, said packaging component comprising a conductor substrate and an electrically conducting layer partly or entirely covering the surface thereof, said electrically conducting layer comprising a rough-surface plated layer having a roughened surface profile on said covered surface, and said rough-surface plated layer further having a surface-plated layer formed thereon, in which said surface-plated layer is a layer reproducing a roughened surface profile of the underlying rough-surface plated layer.

26. A packaging component according to claim 25, wherein the substantially whole surface of said packaging component is occupied by said covered surface and comprises a rough-surface plated layer having a roughened surface profile.

27. A packaging component according to claim 25, wherein the surface of said packaging component comprises an uncovered surface exposed to the outer side in the absence of said insulating resin and/or said adhesive layer, in addition to said covered surface, and, in said uncovered surface, said electrically conducting layer comprises a smooth-surface plated layer having a smooth surface profile.

28. A packaging component according to claim 27, wherein said rough-surface plated layer in said covered surface and said smooth-surface plated layer in said uncovered surface are formed from the same or different plating metals.

29. A packaging component according to claim 26, wherein said rough-surface plated layer in said covered surface and said smooth-surface plated layer in said uncovered surface have the same or different layer thickness.

30. A packaging component according to claim 28, wherein said plating metal is nickel, copper, palladium, gold, silver, tin, chromium or an alloy thereof.

31. A packaging component according to claim 25, wherein the roughened surface profile of said electrically conducting layer has a needle-like crystalline structure of the plating metal.

32. A packaging component according to claim 31, wherein said plating metal is nickel, copper, palladium or an alloy thereof.

33. A packaging component according to claim 25, wherein said electrically conducting layer in said covered surface comprises a smooth-surface plated layer, a rough-surface plated layer and a surface plated layer formed in this order on the conductor substrate.

34. A packaging component according to claim 25, wherein said surface plated layer comprises a metal selected from the group consisting of gold, silver, copper, palladium, nickel, tin, chromium and an alloy thereof.

35. A packaging component according to claim 25, wherein said surface plated layer is a layer having the surface roughened by oxidizing the underlying plated layer.

36. A packaging component according to claim 25, wherein said conductor substrate comprises an alloy or compound of copper of non-copper metal.

37. A packaging component according to claim 36, wherein said non-copper metal is aluminum or iron-nickel.

38. A packaging component according to claim 25, which is a lead frame, a heat-radiating plate or a combination thereof.

39. A semiconductor package comprising at least one semiconductor element in combination with a packaging component described in claim 25.

40. A semiconductor package according to claim 39, wherein said packaging component is a lead frame, said semiconductor element is mounted at a predetermined position on said lead frame and is sealed with an insulating resin.

41. A semiconductor package according to claim 40, wherein substantially the whole surface of said lead frame is sealed with the insulating resin.

42. A semiconductor package according to claim 41, further comprising an externally exposed heat-radiating plate of which the surface is partly exposed to the outer side.

43. A semiconductor package according to claim 40, wherein said lead frame is partly exposed to the outer side.

44. A semiconductor package according to claim 39, wherein said packaging component is a heat-radiating plate of which the surface is partly exposed to the outer side.

45. A semiconductor package according to claim 44, wherein said semiconductor element is mounted on the wiring board, and said heat-radiating plate is bonded to said wiring board via an adhesive layer.

* * * * *

UNITED STATES PATENT AND TRADEMARK OFFICE
CERTIFICATE OF CORRECTION

| | |
|---|---|
| PATENT NO. | : 7,190,057 B2 |
| APPLICATION NO. | : 10/835007 |
| DATED | : March 13, 2007 |
| INVENTOR(S) | : Kazumitsu Seki et al. |

It is certified that error appears in the above-identified patent and that said Letters Patent is hereby corrected as shown below:

Please delete Drawing Sheet 8 of 25 in its entirety and replace with the attached Drawing Sheet 8 of 25.

Column 4, Line 61, change "10 m$^2$);" to --10 μm$^2$);--.

Column 11, Line 5, change "(guad" to --(quad--.

Column 14, Line 25, change "portion" to --portions 1a--.

Column 14, Line 28, change "portion" to --portions--.

Column 14, Line 28, change "recovered" to --covered--.

Column 14, Line 30, change "portion" to --portions--.

Column 14, Line 46, change "portion 14a" to --portions 14'--.

Column 14, Line 48, change "and" to --at--.

Column 14, Line 51, change "14aand" to --14a and--.

Column 14, Line 52, change "14aand" to --14a and--.

Column 21, Line 32, change "year." to --layer.--.

Column 22, Line 34, after "copper" change "of" to --or--.

Signed and Sealed this

Twenty-ninth Day of April, 2008

JON W. DUDAS
*Director of the United States Patent and Trademark Office*